(12) United States Patent
Koba et al.

(10) Patent No.: US 8,963,637 B2
(45) Date of Patent: Feb. 24, 2015

(54) SEMICONDUCTOR DEVICE AND COMMUNICATION DEVICE

(71) Applicant: Hitachi, Ltd., Chiyoda-ku, Tokyo (JP)

(72) Inventors: Hideki Koba, Ome (JP); Keiki Watanabe, Tachikawa (JP); Kouji Fukuda, Chofu (JP)

(73) Assignee: Hitachi, Ltd, Tokyo (JP)

( * ) Notice: Subject to any disclaimer, the term of this patent is extended or adjusted under 35 U.S.C. 154(b) by 37 days.

(21) Appl. No.: 13/901,387

(22) Filed: May 23, 2013

(65) Prior Publication Data
US 2013/0314158 A1    Nov. 28, 2013

(30) Foreign Application Priority Data

May 24, 2012 (JP) ................................. 2012-118190

(51) Int. Cl.
*H03F 3/45* (2006.01)
(52) U.S. Cl.
USPC ............................ 330/254; 330/9; 330/124 R
(58) Field of Classification Search
USPC ........................................ 330/254, 9, 124 R
IPC ......................................................... H03F 3/45
See application file for complete search history.

(56) References Cited

U.S. PATENT DOCUMENTS

| 6,552,593 | B2 * | 4/2003 | Blon et al. ..................... 327/307 |
| 7,085,587 | B2 * | 8/2006 | Oono et al. ................. 455/553.1 |
| 7,696,817 | B1 * | 4/2010 | Boucher et al. ................... 330/9 |
| 8,729,452 | B2 * | 5/2014 | Tatsumi ..................... 250/214 A |
| 2003/0020544 | A1 * | 1/2003 | Behzad ......................... 330/254 |
| 2005/0075088 | A1 | 4/2005 | Ono et al. |
| 2005/0197084 | A1 * | 9/2005 | Hamasaki et al. .......... 455/189.1 |
| 2013/0027136 | A1 * | 1/2013 | Ossieur et al. ................. 330/279 |

FOREIGN PATENT DOCUMENTS

JP      2005-110080 A      4/2005

* cited by examiner

*Primary Examiner* — Patricia Nguyen
(74) *Attorney, Agent, or Firm* — Miles & Stockbridge P.C.

(57) ABSTRACT

A semiconductor device capable of achieving high speed performance in addition to correction of differential offset and a communication device provided with the semiconductor device are provided. For example, there are provided: a variable gain type differential amplifier circuit VGA1 which receives a gain setting signal ASET, which amplifies differential input signals INP and INN by a gain indicated by the gain setting signal, and which outputs differential output signals OUTP' and OTUN'; and an offset correcting circuit unit OFCBK1 which cancels an offset voltage (VOF and VOFO) generated in the VGA1. Here, the OFCBK1 cancels an output offset voltage VOFO (which results in an input offset voltage VOF) by receiving the ASET, generating a correction voltage changed in accordance with the gain, and adding the correction voltage to the OUTP' and OUTN'.

6 Claims, 15 Drawing Sheets

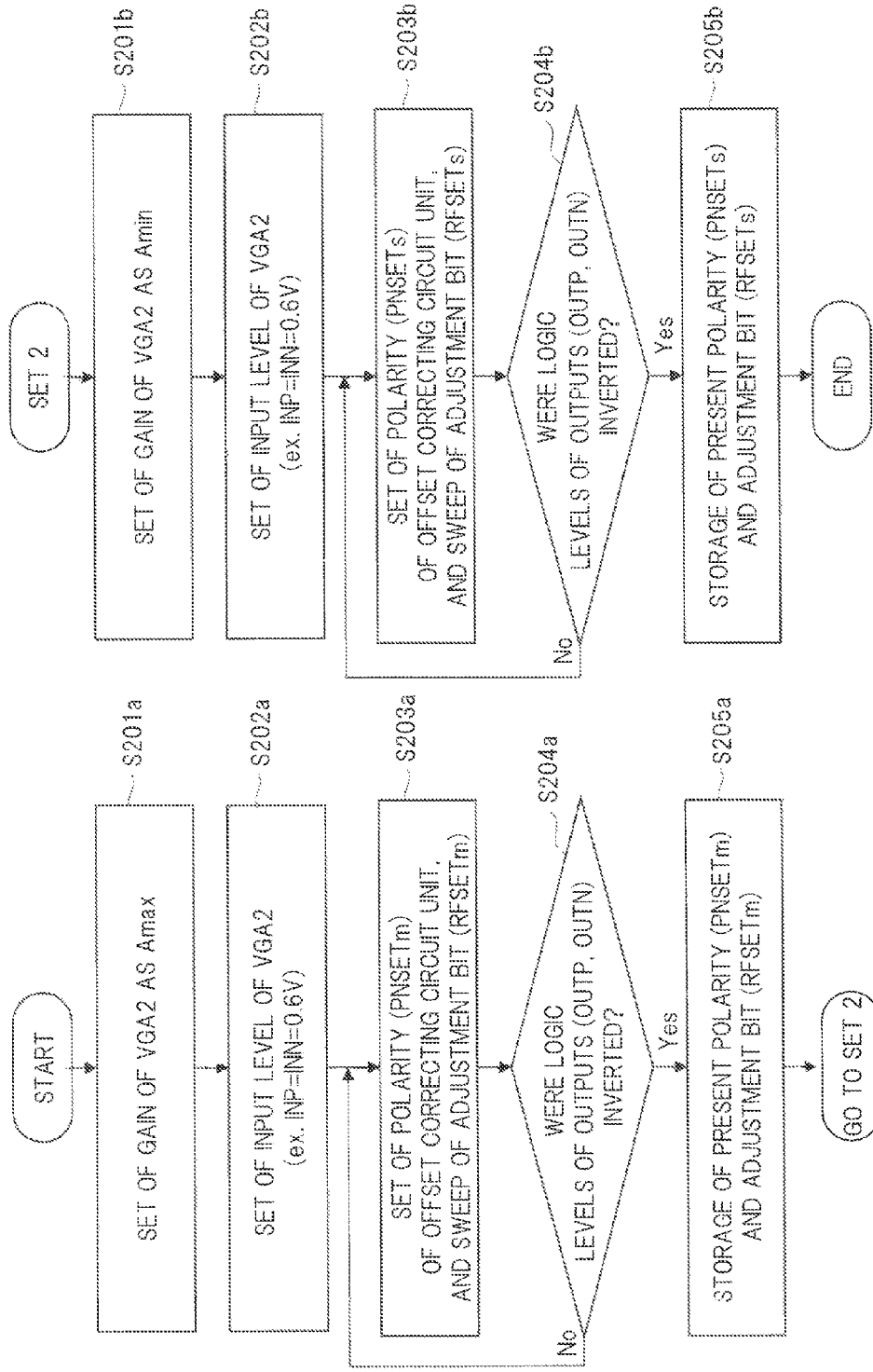

SEMICONDUCTOR DEVICE AND COMMUNICATION DEVICE

CROSS-REFERENCE TO RELATED APPLICATION

The present application claims priority from Japanese Patent Application No. 2012-118190 filed on May 24, 2012, the content of which is hereby incorporated by reference into this application.

TECHNICAL FIELD OF THE INVENTION

The present invention relates to a semiconductor device and a communication device. For example, the present invention relates to a technique effectively applied to a semiconductor device which re-drives a signal on a high-speed communication route and relates to a communication device including the semiconductor device.

BACKGROUND OF THE INVENTION

For example, Japanese Patent Application Laid-Open Publication No. 2005-110080 (Patent Document 1) describes an offset correction method which detects differential output voltages in a state that differential input voltages of a variable gain type amplifier are set to be the same electric potential as each other and which applies an offset voltage between differential input terminals of the variable gain type amplifier so that the differential output voltages become zero.

SUMMARY OF THE INVENTION

For example, in a differential amplifier circuit, when a manufacturing variation occurs between a pair of MOS transistors or others which play a role of a differential pair, a so-called differential offset occurs. In a semiconductor device such as a differential amplifier circuit, normally, influence of the manufacturing variation becomes remarkable more as advancing a miniaturization (40 nm, 28 nm, . . . ) of a manufacturing process, and therefore, it has been increasingly important to correct such a differential offset.

Under such circumstances, in a semiconductor device such as a differential amplifier circuit, a high speed performance has been advanced in addition to the miniaturization of the manufacturing process. The differential amplifier circuit is used as, for example, an interface circuit or others in a communication system with high speed of several tens of Gbps or higher, and a variable gain type is used in some cases depending on various aims. In order to correct the differential offset in such a variable gain type differential amplifier circuit, it is considered to apply a correction voltage between input terminals of the differential amplifier circuit as described in, for example, Patent Document 1 However, in this case, there is a risk that the high speed performance is inhibited by an input capacity of an offset correcting circuit or others provided on the input side of the differential amplifier circuit.

The present invention has been made in consideration of such a problem, and one preferred aim of the present invention is to provide a semiconductor device capable of achieving correction of the differential offset and the high speed performance, and to provide a communication device provided with the semiconductor device. The above and other preferred aims and novel characteristics of the present invention will be apparent from the description of the present specification and the accompanying drawings.

The typical ones of the inventions disclosed in the present application will be briefly described as follows.

A semiconductor device according to the present embodiment includes: a variable gain type differential amplifier circuit which receives a gain setting signal, amplifies a differential input signal based on a gain indicated by the gain setting signal, and outputs a differential output signal; and a correcting circuit which cancels an offset voltage generated in the differential amplifier circuit. Here, the correcting circuit receives the gain setting signal, generates the correction voltage changed in accordance with the gain, and adds the correction voltage to the differential output signal, so that the offset voltage is cancelled.

According to one embodiment described above, in the semiconductor device including the differential amplifier circuit and the communication device provided with the semiconductor device, the high speed performance in addition to the correction of the differential offset can be achieved.

BRIEF DESCRIPTIONS OF THE DRAWINGS

FIG. 13 is a flow chart illustrating an example of an initial setting method in accordance with offset correction of the semiconductor device of FIG. 12.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

Also, a circuit element configuring each functional block of the embodiments are formed on a semiconductor substrate made of single crystal silicon or others by an integrated circuit technique such as a publicly-known CMOS (complementary-type MOS transistor) although not particularly limited. Note that, in the embodiments, a MOSFET (Metal Oxide Semiconductor Field Effect Transistor) (abbreviated as MOS transistor) is used as one example of a MISFET (Metal Insulator Semiconductor Field Effect Transistor). However, a non-oxide film is not eliminated as a gate insulating film.

Hereinafter, embodiments of the present invention will be described in detail based on the accompanying drawings. Note that the same components are denoted by the same reference symbols throughout all the drawings for describing the embodiments, and the repetitive description thereof will be omitted.

First Embodiment

Summary of (Principal Part of) Semiconductor Device

Figure 1:
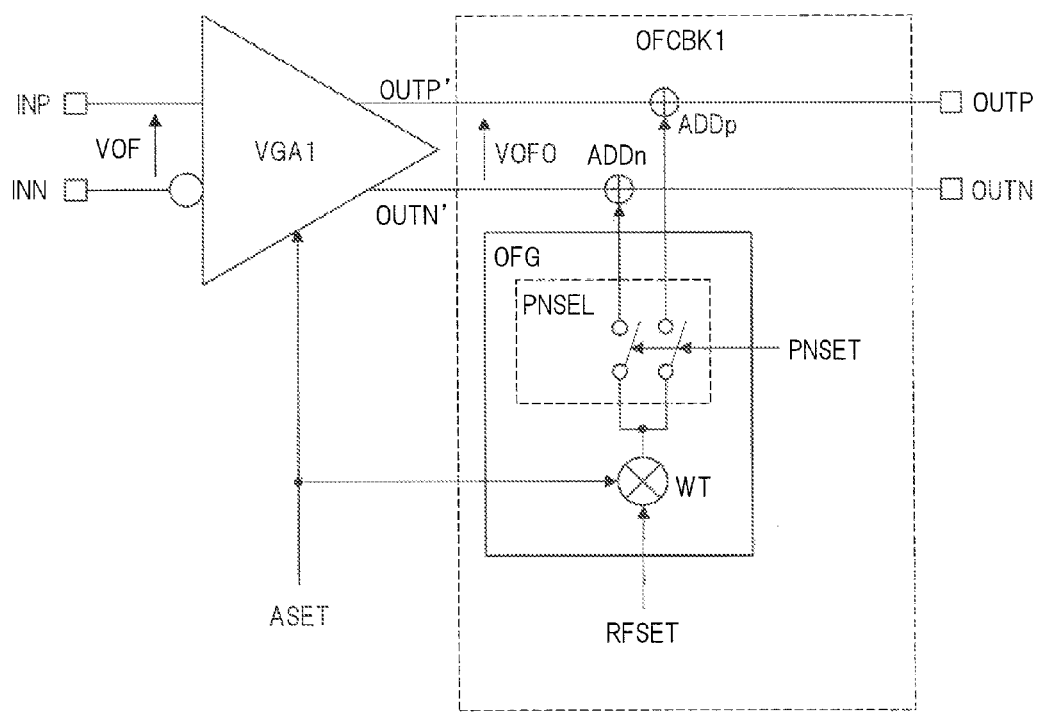
FIG. 1 is a functional block diagram illustrating a schematic configuration example of a principal part of a semiconductor device according to a first embodiment of the present invention.

FIG. 1 is a functional block diagram illustrating a schematic configuration example of a principal part of a semiconductor device according to a first embodiment of the present invention. A semiconductor device illustrated in FIG. 1 is provided with a variable gain type differential amplifier circuit VGA1 and an offset correcting circuit unit OFCBK1 provided on an output side of the variable gain type differential amplifier circuit. The VGA1 receives differential input signals INP and INN, performs an amplifying operation based on a gain in accordance with a gain setting signal ASET, and outputs differential output signals OUTP' and OUTN'. The OFCBK1 is provided with an offset correction level generating circuit OFG and adder units ADDp and ADDn which add an offset correction level generated by the OFG to the OUTP' and OUTN' and which output differential output signals OUTP and OUTN.

The offset correction level generating circuit OFG is provided with: a weighting unit (multiplication unit) WT which weights a reference setting level RFSET in accordance with the gain setting signal ASET; and a polarity selecting unit PNSEL which selects a polarity in which an output of the WT is reflected. In accordance with a polarity selecting signal PNSET, the PNSEL selects either addition of the output of the WT to the differential output signal OUTP' via the adder unit ADDp or addition thereof to the differential output signal OUTN' via the adder unit ADDn.

Figure 2:
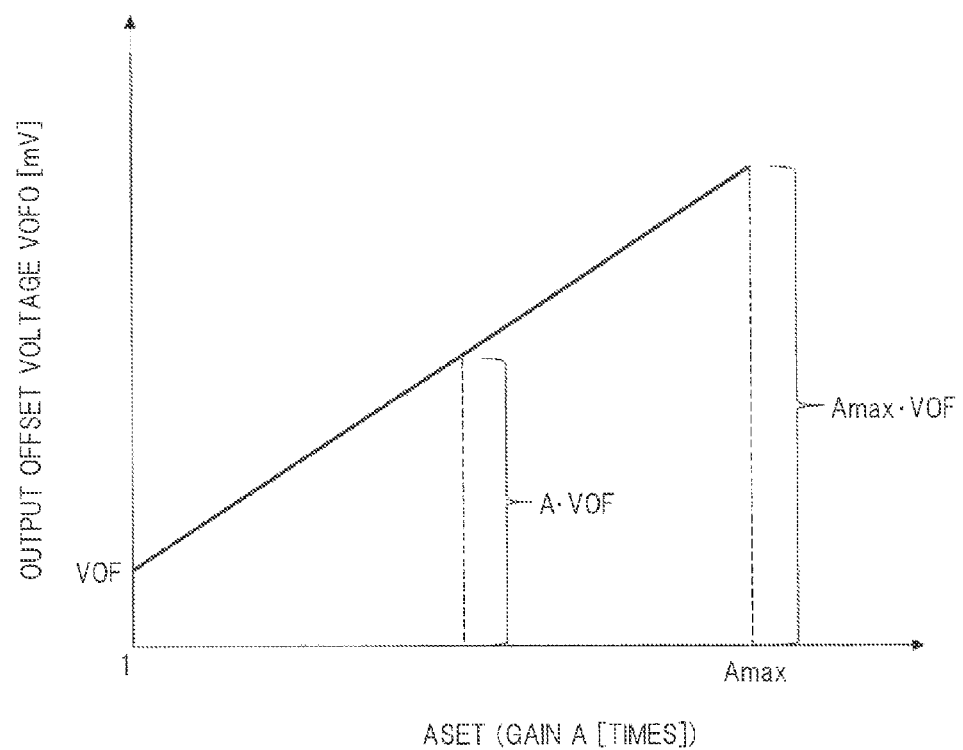
FIG. 2 is a diagram explaining an operation example of an offset correcting circuit unit in FIG. 1.

FIG. 2 is a diagram explaining an operation example of the offset correcting circuit unit in FIG. 1. As illustrated in FIG. 2, when an input offset voltage of a VOF in terms of input conversion is generated by, for example, the manufacturing variation in the variable gain type differential amplifier circuit VGA1 of FIG. 1, the VOF is amplified by the VGA1 in multiples of a gain A indicated by the gain setting signal ASET, and appears on the differential output signals OUTP' and OUTN' as an output offset voltage VOFO expressed as "(A×VOF)". Accordingly, the offset correcting circuit unit OFCBK1 of FIG. 1 generates an offset correction voltage whose level is equivalent to a level of the VOFO by the offset correction level generating circuit OFG, selects either the adder unit ADDp or the adder unit ADDn, and adds the offset correction voltage to either the OUTP' or the OUTN'.

For example, if a positive output offset voltage VOFO is generated on the OUTP' with reference to the differential output signal OUTN', a positive offset correction voltage outputted from the weighting unit (multiplication unit) WT is added to the OUTN' via the adder unit ADDn (alternatively, is subtracted from the OUTP' via the ADDp). Conversely, if a positive VOFO is generated on the OUTN' with reference to the OUTP', a positive offset correction voltage outputted from the WT is added to the OUTP' via the ADDp (alternatively, is subtracted from the OUTN' via the ADDn). In this manner, the VOFO and the offset correction voltage are cancelled from each other, and an offset voltage in the differential output signals OUTP and OUTN becomes zero.

Here, more specifically, an initial setting in accordance with the offset correction is performed by, for example, the following method. First, the differential input signals INP and INN of FIG. 1 are set to the same electric potential as each other, and a predetermined gain A is set in accordance with the gain setting signal ASET. In this state, if the reference setting level. RFSET of FIG. 1 is set to zero, the output offset voltage VOFO (="A×VOF") in accordance with the polarity of the input offset voltage VOF and the voltage level thereof is observed in the differential output signals OUTP and OUTN. Accordingly, the polarity on the side where this VOFO is cancelled is determined by the polarity selecting signal PNSET, and the level of the RFSET is gradually increased in this selection state. Then, the differential output signals OUTP and OUTN become zero at any point (for example, inversion of a logic level is observed in the OUTP and OUTN), and, as a result, the value (="A×VOF") of the VOFO is determined.

By determining the value (="A×VOF") of the output offset voltage VOFO, a value of the input offset voltage VOF is also determined because the value of the gain A has been previously determined, so that the VOFO can be corrected (cancelled) for various values of the gain A based on characteristics as illustrated in FIG. 2. Practically, note that states of the reference setting level RFSET and the polarity selecting signal PNSET at the point when the differential output signals OUTP and OUTN become zero as described above may be maintained. Then, even if the gain A is changed by the gain setting signal ASET, the weighting unit (multiplication unit) WT of FIG. 1 automatically weights the RFSET so as to be coordinated with the gain A, and therefore, the VOFO is automatically corrected (cancelled) regardless of the variation of the gain. A.

<<Main Effect of (Principal Part of) Semiconductor Device or Others>>

By using the offset correction method as illustrated in FIGS. 1 and 2, for example, the following effect can be obtained. First, the high speed performance is achieved as compared with a case that the offset correction is performed on the input side since the offset correcting circuit unit OFCBK1 is arranged on the output side of the variable gain type differential amplifier circuit VGA1 so that the offset correction is performed on the output side. That is, the VGA1 plays such a role often as amplifying the differential input signals INP and INN, whose voltage levels have been decreased, so as to be a predetermined voltage level, in such a case, the input capacity of the VGA1 in accordance with this offset correction on the input side affects on the INP and the INN having the small voltage level, and therefore, can be a main factor inhibiting the high speed performance. On the other hand, since the voltage levels of the differential output signals OUTP' and OUTN' have been increased to some extent, influence of the output capacity of the VGA1 on the high speed performance is smaller than that of the input capacity. As a result, the high speed performance can be achieved by performing the offset correction on the output side.

Secondly, a higher resolution (high accuracy) performance of the offset correction can be achieved by performing the offset correction on the output side than performing the offset correction on the input side. That is, for example, when the offset voltage VOF is generated on the input side, the offset voltage expressed as "(A×VOF)" by using the gain A is to be generated on the output side. Therefore, for example, when the offset correction on the output side is performed in increments of a voltage size step of ΔV1, the offset correction on the input side is equivalently to be performed in increments of a voltage size step of "((1/A)×ΔV1)" (note that a relation of "A>1" is established). As a result, the offset correction can be performed in increments of a smaller voltage size step by performing the offset correction on the output side than performing the offset correction on the input side, and therefore, the high resolution (high accuracy) performance of the offset correction can be achieved by a degree of the voltage size step. In addition, from another viewpoint, if a voltage step size of "ΔV2" is required on the input side in order to cancel the offset voltage, a voltage step size of "(A×ΔV2)" (note that a relation of "A>1" is established) is sufficient for the cancel on the output side, and therefore, the offset correcting circuit unit OFCBK1 can be simplified by the degree of the voltage size step.

Here, as understood from this second effect, in the initial setting in accordance with the above-described offset correction, the initial setting in a state that the gain of the variable gain type differential amplifier circuit VGA1 is set to the maximum value "Amax" is desired. In this case, a magnitude of the input offset voltage VOF is detected by equivalently the minimum voltage step size "((1/Amax)×ΔV1)" (note that a relation of "A>1" is established) in accordance with the search operation of the reference setting level. RFSET, and, as a result, further higher resolution (higher accuracy) performance of the offset correction can be achieved.

Note that the initial setting in accordance with the offset correction has been performed here by performing the search operation of the reference setting level RFSET once in the state that the gain of the variable gain type differential amplifier circuit VGA1 is set to the predetermined gain A (desirably the maximum value Amax) In this manner, time required for the initial setting can be shortened. However, in this case, it is required to accurately secure a slope (linearity) of the characteristics in FIG. 2 to some extent by the weighting unit (multiplication unit) WT of FIG. 1. Therefore, for example, it is difficult to secure this linearity, the linearity can be corrected by performing a search operation a plurality of times with a different gain.

<<Details of Variable Gain Type Differential Amplifier Circuit>>

FIGS. 3A, 3B, 3C, and 3D are circuit diagrams illustrating different detailed configuration examples of the variable gain type differential amplifier circuit in FIG. 1 from each other. Each of variable gain type differential amplifier circuits VGA11 to VGA14 illustrated in FIGS. 3A to 3D is provided with: NMOS transistors (MN1 (MNv1) and MN2 (MNv2)) configuring differential pair transistors; a tail current source (ISVg (NN3)); and two load resistors (R1 (Rv1) and R2 (Rv2)). One end of the tail current source is connected to a common source node of the differential pair transistors, and the other end thereof is connected to a ground source voltage GND. One end of each of the two load resistors is connected to each drain node of the differential pair transistors, and the other end thereof is connected to a source voltage VCC. The differential input signals INP and INN are inputted to respective gates of the differential pair transistors, and the differential output signals OUTP' and OUTN' are outputted from respective drains of the differential pair transistors.

Figure 3A:
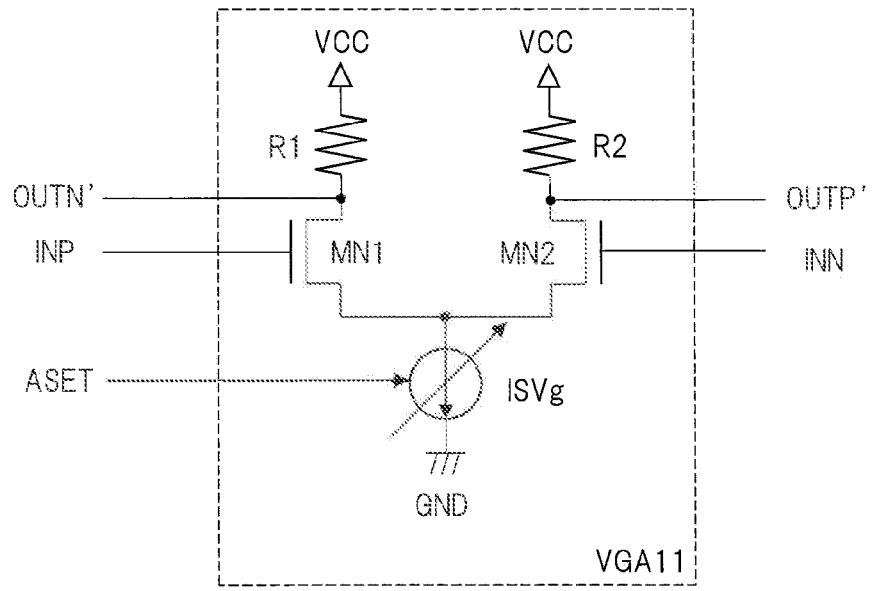
FIG. 3A is a circuit diagram illustrating a detailed configuration example of a variable gain type differential amplifier circuit in FIG. 1.
Figure 3B:
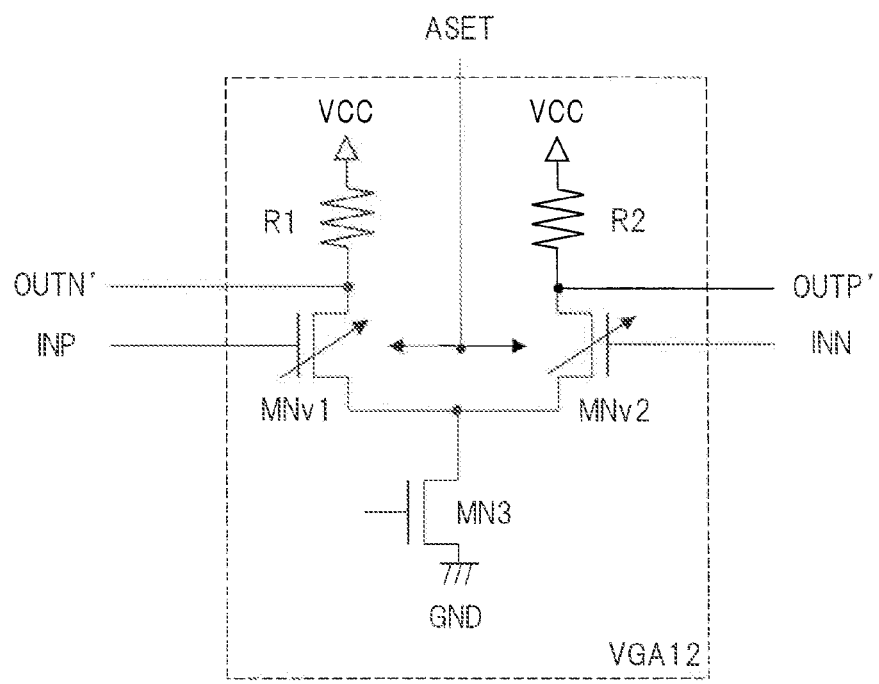
FIG. 3B is a circuit diagram illustrating another detailed configuration example of the variable gain type differential amplifier circuit in FIG. 1.
Figure 3C:
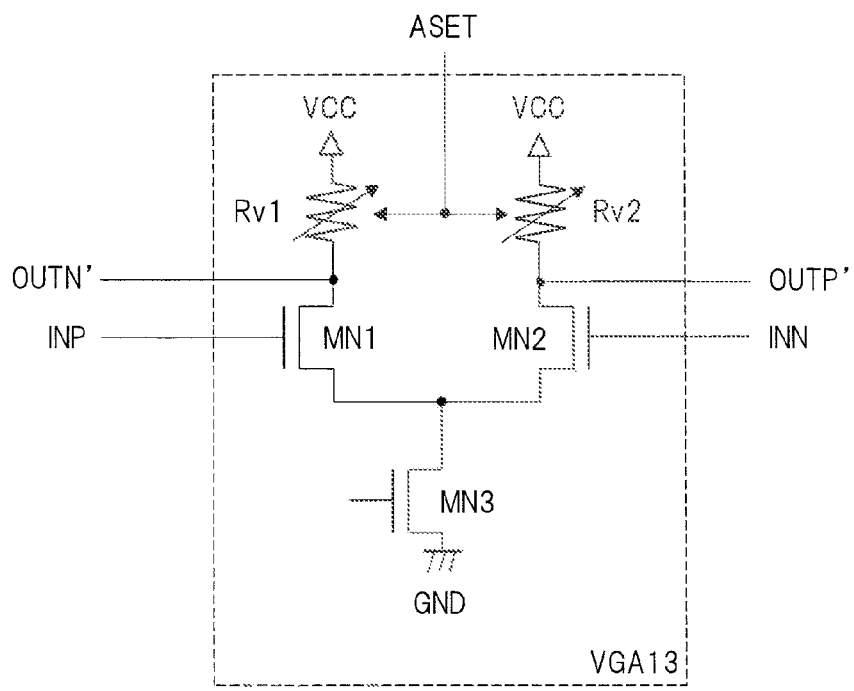
FIG. 3C is a circuit diagram illustrating still another detailed configuration example of the variable gain type differential amplifier circuit in FIG. 1.
Figure 3D:
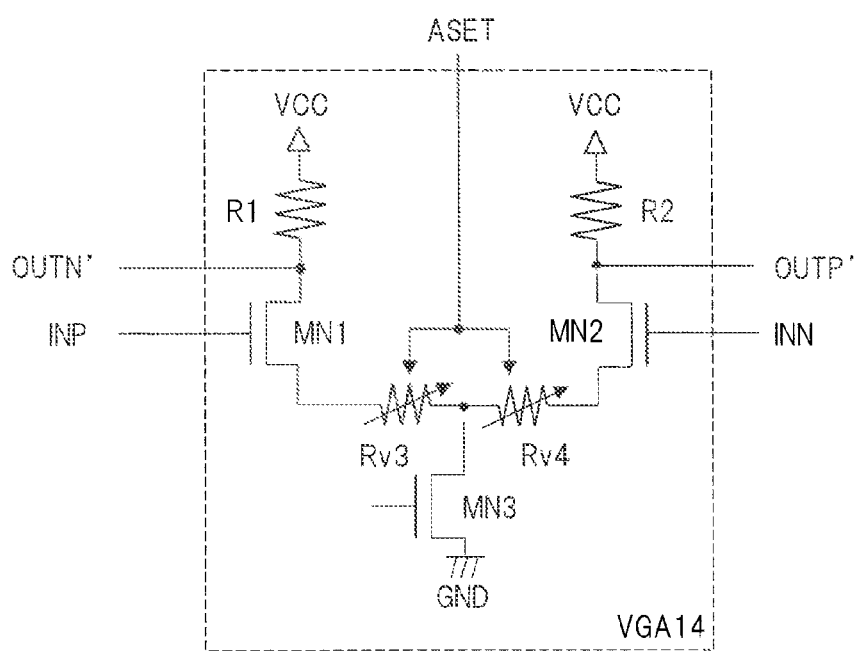
FIG. 3D is a circuit diagram illustrating still another detailed configuration example of the variable gain type differential amplifier circuit in FIG. 1.

Here, in the VGA11 of FIG. 3A, the tail current source is a variable current source ISVg, and the variable gain can be achieved by setting a current value of the ISVg by the gain setting signal ASET. In the VGA12 of FIG. 3B, transistor sizes of the NMOS transistors MNv1 and MNv2 configuring the differential pair transistors can be variably set, and the variable gain can be achieved by setting the transistor sizes by the ASET. In the VGA13 of FIG. 3C, the two load resistors re variable resistors Rv1 and Rv2, and the variable gain can be achieved by setting resistance values of the Rv1 and the Rv2 by the ASET. In the VGA14 of FIG. 3D, variable resistors Rv3 and Rv4 are inserted between the respective sources of the NMOS transistors MN1, MN2 and one end of the tail current source (NMOS transistor MN3), and the variable gain can be achieved by setting the resistance values of the Rv3 and the Rv4 by the ASET.

Such a gain of the differential amplifier circuit is almost determined by a product (gm×R) of a mutual conductance (gm) of the differential pair transistors with a resistance value (R) of the load resistor. A value of the gm is controlled in FIGS. 3A and 3B, a value of the R is controlled in FIG. 3C, and the value of the gm is equivalently controlled via the source resistance in FIG. 3D.

When the manufacturing variation or others occurs, such a differential amplifier circuit causes, for example, a state that the transistor size of one (MN1) of the differential pair transistors is different from the transistor size of the other (MN2) thereof or a state that the resistance value of one (R1) of the load resistors is different from the resistance value of the other (R2) thereof. In these cases, a gain of a right-half circuit of the differential amplifier circuits is different from a gain of a left-half circuit thereof, and therefore, the non-zero output offset voltage VOFO is generated in the differential output signals OUTP' and OUTN' as illustrated in FIG. 2 or others even if the differential input signals INP and INN are zero. This output offset voltage (VOFO) can be converted into the input offset voltage VOF generated between the INP and the INN.

Such an offset voltage (DC offset) can be corrected by, for example, applying such a correction voltage as cancelling the input offset voltage VOF between the differential input nodes (INP and INN). In this case, it is only required to apply a certain correction voltage regardless of the gains of the differential amplifier circuits, and therefore, the offset correction can be simplified. On the other hand, such a problem as speed reduction due to the input capacity as described above may arise. Accordingly, it is useful to use the above-described offset correction method according to the present embodiment.

<<Details of Offset Correcting Circuit Unit>>

Figure 4A:
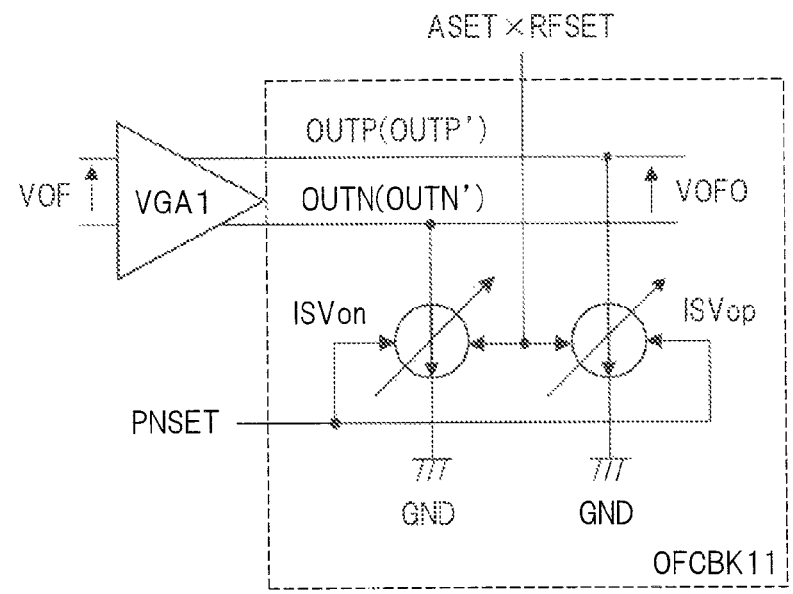
FIG. 4A is a circuit diagram illustrating a detailed configuration example of the offset correcting circuit unit in FIG. 1.

FIGS. 4A, 4B, 4C, and 4D are circuit diagrams illustrating different detailed configuration examples of the offset correcting circuit unit in FIG. 1 from each other. An offset correcting circuit unit OFCBK11 illustrated in FIG. 4A is provided with: a variable current source ISVop connected between a positive electrode side (OUTP') of the differential output nodes in the variable gain type differential amplifier circuit VGA1 and the ground source voltage GND; and a variable current source ISVon connected between a negative electrode side (OUTN') of the differential output nodes and the GND. Either the ISVop or the ISVon is activated by the polarity selecting signal PNSET, and its current value is set so that the result of the multiplication of the gain setting signal ASET with the reference setting level RESET is reflected therein. By using such a configuration, the current from either the ISVop or the ISVon is converted into a voltage via the output resistor of the VGA1, and the voltage is added to either the differential output signal OUTP' or OUTN' as the offset correction voltage. As a result, the differential output signals OUTP and OUTN in which the offset voltage is cancelled are obtained.

Figure 4B:
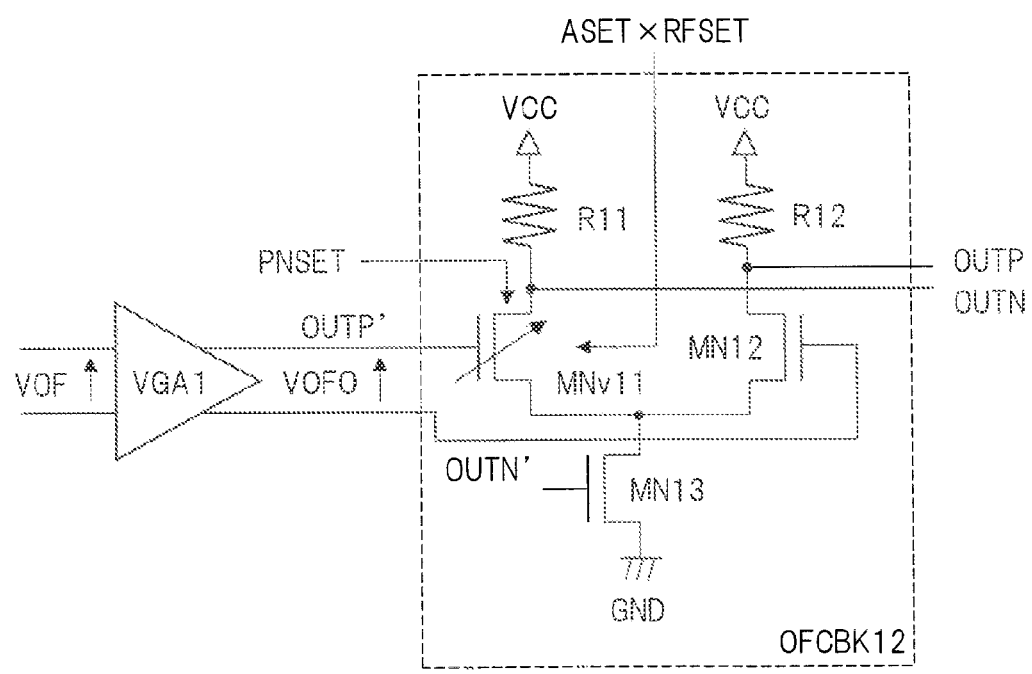
FIG. 4B is a circuit diagram illustrating another detailed configuration example of the offset correcting circuit unit in FIG. 1.
Figure 4C:
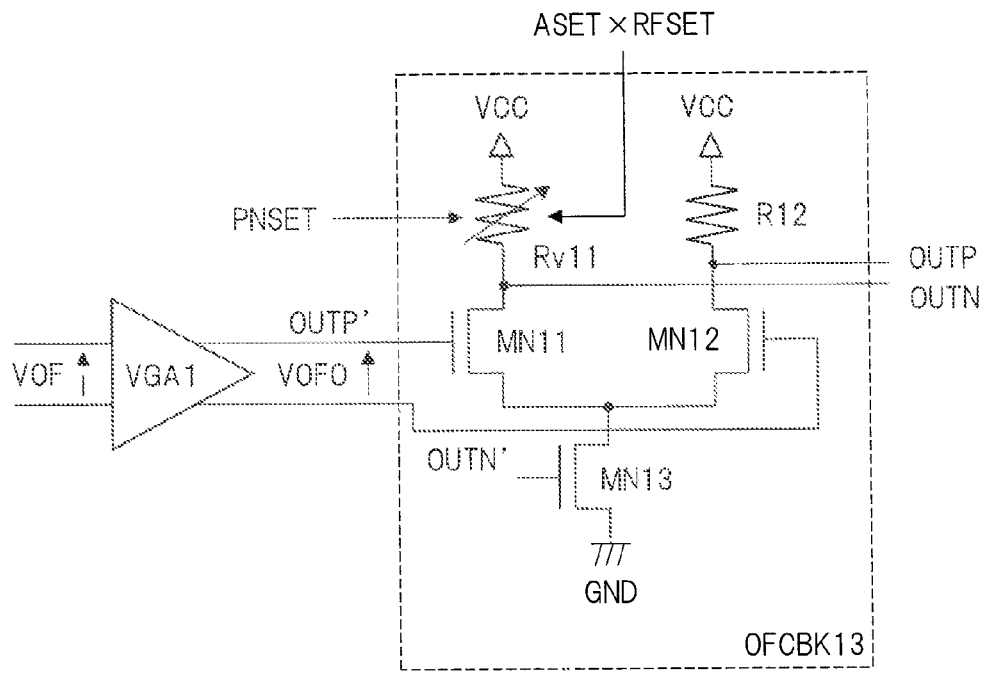
FIG. 4C is a circuit diagram illustrating still another detailed configuration example of the offset correcting circuit unit in FIG. 1.
Figure 4D:
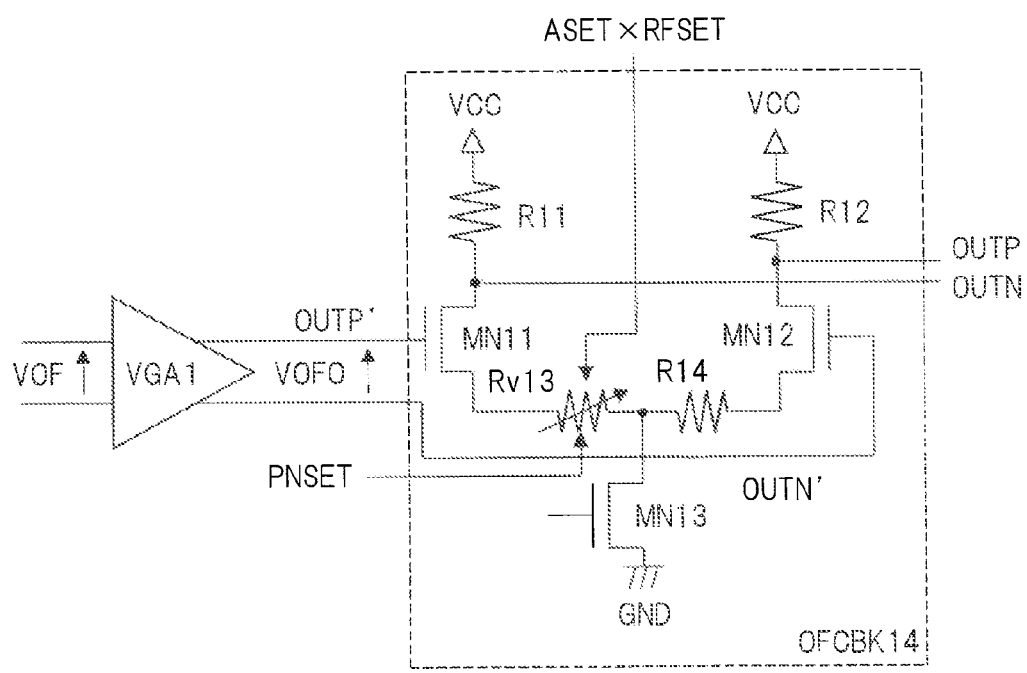
FIG. 4D is a circuit diagram illustrating still another detailed configuration example of the offset correcting circuit unit in FIG. 1.

Meanwhile, each of offset correcting circuit units OFCBK12 to OFCBK14 illustrated in FIGS. 4B to 4D is provided with: NMOS transistors (MN11 (MNv11) and MN12) configuring the differential pair transistors; a tail current source (NMOS transistor MN13); and two load resistors (R11 (Rv11) and R12). One end of the tail current source is connected to a common source node of the differential pair transistors, and the other end thereof is connected to the ground source voltage GND. One ends of the two load resistances are connected to respective drain nodes of the differential pair transistors, and the other ends thereof are connected to respective source voltages VCC. The differential output signals OUTP' and OUTN' are inputted into respective gates of the differential pair transistors, and the differential output signals OUTP and OUTN are outputted from respective drains of the differential pair transistors.

An offset amplifier mode is employed in FIGS. 4B to 4D, and the offset voltage is corrected in the mode by willfully making asymmetry between the right-half circuit of the differential amplifier circuits and the left-half circuit thereof so that a degree of this asymmetry can be adjusted. In the OFCBK12 of FIG. 4B, the transistor size of one (NMOS transistor MNv11) of the differential pair transistors can be adjusted so that the polarity selecting signal PNSET and the result of the multiplication of the gain setting signal ASET with the reference setting level RFSET are reflected therein. More specifically, for example, the other (NMOS transistor MN12) of the differential pair transistors is configured of x pieces of unit transistors, one (MNv11) thereof is configured of y (>x) pieces of unit transistors, and an effective number of the unit transistors on the MNv11 side can be variably set around x pieces as a center value in a range of $\pm(y-x)$ pieces.

In the OFCBK13 of FIG. 4C, the resistance value of one (variable resistance Rv11) of the two load resistors can be adjusted so that the polarity selecting signal PNSET and the result of the multiplication of the gain setting signal ASET with the reference setting level RFSET are reflected therein. Also in this case, for example, as similar to the case of FIG. 4B, the other (resistor R12) of the load resistances is configured of x pieces of unit resistors, one (Rv11) thereof is configured of y (>x) pieces of unit resistors, and an effective number of the unit resistors on the Rv11 side can be variably set. On the other hand, in the OFCBK14 of FIG. 4D, resistors Rv13 and R14 are inserted between the respective sources of the NMOS transistors MN11, MN12 and one end of the tail current source, and an effective number of the unit resistors on the variable resistor Rv13 side can be variably set as similar to the case of FIG. 4C.

As described above, for example, the circuit modes as illustrated in FIGS. 4A to 4D can be employed as the offset correcting circuit unit. However, as compared with the mode as illustrated in FIG. 4A, in some cases, the modes as illustrated in FIGS. 4B to 4D complicate a method of controlling the transistor sizes of the differential pair transistors and the resistance value of the variable resistor in cooperation with the gain setting signal ASET and a method of suitably manufacturing the transistor sizes and the resistance value in accordance with the control. Therefore, in this viewpoint, it is desired to use the mode as illustrated in FIG. 4A. In addition, although the offset correction is performed by the circuit mode using the current source in FIG. 4A, the offset correction can be performed by a circuit mode using a voltage source. However, in this case, usually, not only the simple connection as illustrated in FIG. 4A but also an adder circuit is required when the correction voltage from the voltage source is reflected in the differential output signals OUTP' and OUTN' and therefore, it is desired to use the mode as illustrated in FIG. 4A in this viewpoint.

<<Summary of Communication Device>>

Figure 5A:
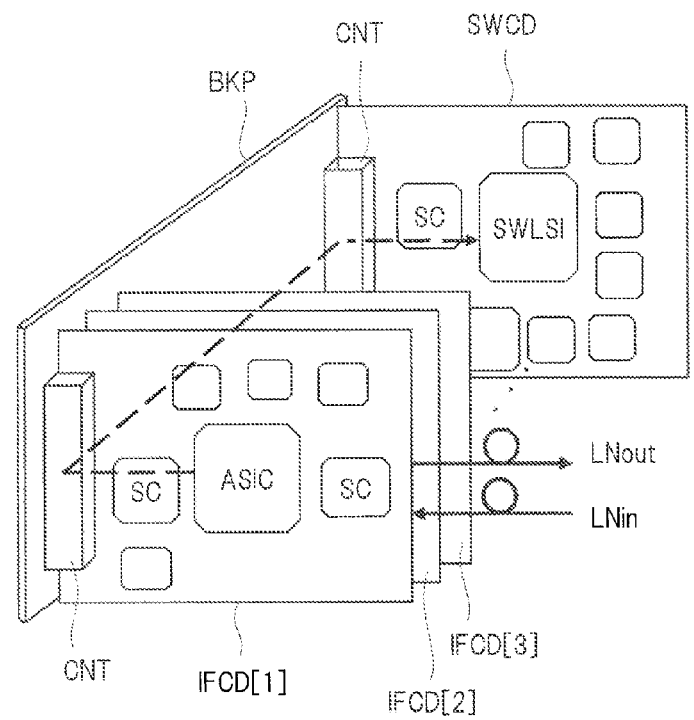
FIG. 5A is an outline diagram illustrating a schematic configuration example of a communication device according to the first embodiment of the present invention.

FIG. 5A is an outline diagram illustrating a schematic configuration example of a communication device according to the first embodiment of the present invention, and FIG. 5E is a block diagram illustrating a configuration example of a re-driving circuit (semiconductor device) in FIG. 5A. The communication device illustrated in FIG. 5A is, for example, a router device or others, and is provided with: a backplane on which a plurality of card connectors CNTs are mounted; interface cards (wiring board) IFCD [1], IFCD [2], . . . and a switch card (wiring board) SWCD which are appropriately inserted into the CNTs; and others. Each interface card IFCD is provided with: terminals for connection with external communication cables LNin and LNout (such as an Ethernet cable, an optical fiber cable, or others); a processing device ASIC which performs pre-determined communication protocol processing or others; and others. In addition, the SWCD is provided with: a switch device SWLSI which selects and divides a route between a plurality of input terminals and a plurality of output terminals; and others.

The backplane BKP supplies a power to each card via the card connector CNT, and has a communication route between the respective cards. For example, each interface card IFCD is connected to the switch card SWCD via the BKP, so that the communication (that is, routing) via the SWCD between the respective IFCDs can be achieved. Here, a size of the BKP exceeds, for example, 1 m in some cases, and, as a result, a length of each communication route between the IFCD and the SWCD variously differs. Accordingly, in order to compensate variation in a signal level due to the difference in the length of the communication route, a semiconductor device (semiconductor element) on which a re-driving circuit (signal conditioner) SC is mounted is implemented on each card.

As illustrated in FIG. 5E, the re-driving circuit (signal conditioner) SC is provided with, for example: the variable gain type differential amplifier circuit VGA; the offset correcting circuit unit OFCBK; a fixed gain amplification unit LABK; clock/data reproduction circuit CDR; and others. Among them, the above-described configuration example is employed to the VGA and the OFCBK. The VGA is provided at, for example, a first stage of an input terminal IN so as to amplify a signal level decreased via the communication route on the backplane BKP in FIG. 5A. However, since the gain generally decreases as increasing the speed performance in the amplifier circuit, the fixed gain amplification unit LABK including fixed gain type differential amplifier circuits LA1 and LA2 and an offset amplifier OA is provided at a later stage than the VGA (OFCBK) here so that a sufficient gain is secured. An output signal of the LABK is outputted to, for example, an output terminal OUT1 so as to bypass or an output terminal OUT2 via the CDR after a clock signal and a data signal are reproduced.

In such a re-driving circuit (signal conditioner) SC, upon the initial setting in accordance with the offset correction, for example, a differential input of the fixed gain type differential amplifier circuit LA1 is short-circuited first, and the offset amplifier OA is adjusted while monitoring the reproduced data signal from the clock/data reproduction circuit CDR until a logical level of the signal is inverted. The offset amplifier OA has, for example, the same configuration as any of those of FIGS. 4E to 4D described above, and the offset correction of the entire fixed gain amplification unit LABK is performed by adjusting a variable parameter thereof. Then, via the LABK to which the offset correction has been performed, the offset correcting circuit unit OFCBK is adjusted while monitoring the reproduced data signal from the CDR until a logical level of the signal is inverted. A specific adjusting method at this time is as described in FIGS. 1 and 2 or others.

More particularly, such a communication device has sometimes the case that the communication route on the backplane BKP is long (for example, exceeds 1 m), and therefore, there is a risk that the high speed performance (of several tens of Gbps or higher) is inhibited by adding an excessive capacity onto the communication route. Accordingly, it is useful to use the offset correction mode according to the present embodiment including the offset correcting circuit unit OFCBK on not the input side of the variable gain type differential amplifier circuit VGA but the output side thereof.

In the foregoing, by using the semiconductor device and the communication device according to the present first embodiment, representatively, the correction of the differential offset and the high speed performance can be achieved.

Second Embodiment

Schematic Circuit Configuration of (Principal Part of) Semiconductor Device

Figure 6:
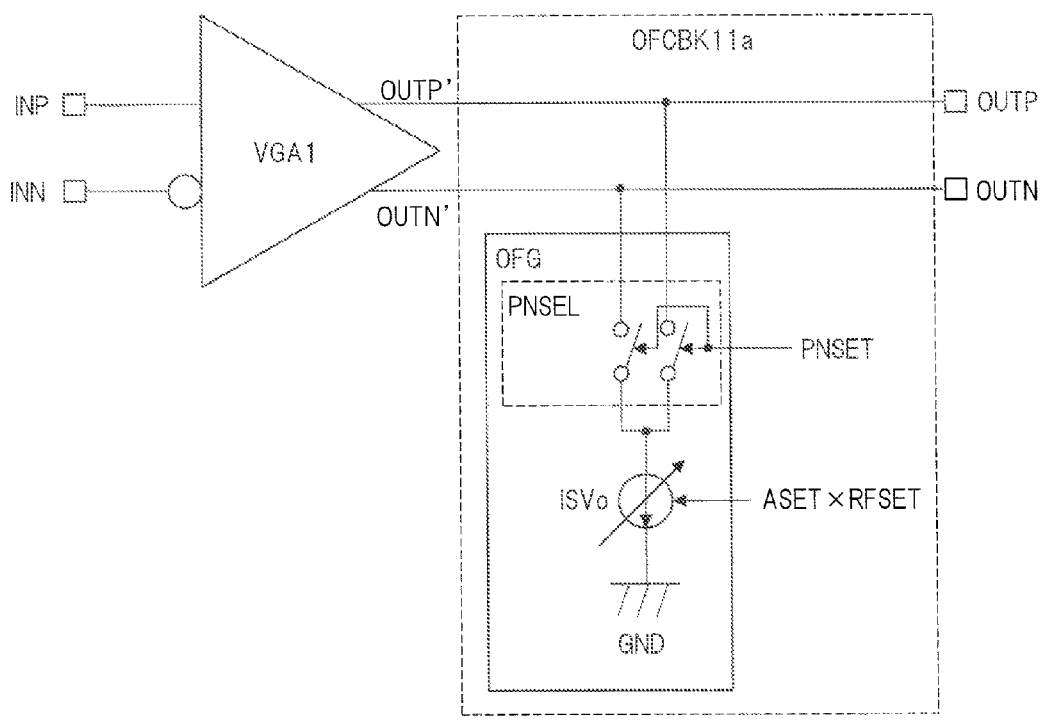
FIG. 6 is a circuit block diagram illustrating a schematic configuration example of a principal part of a semiconductor device according to a second embodiment of the present invention.

FIG. 6 is a circuit block diagram illustrating a schematic configuration example of a principal part of a semiconductor device according to a second embodiment of the present invention. The semiconductor device illustrated in FIG. 6 is obtained by employing the circuit mode of FIG. 4A to the offset correcting circuit unit of FIG. 1 described in the first embodiment and further improving the circuit.

An offset correcting circuit unit OFCBK11a illustrated in FIG. 6 is provided with one variable current source ISVo and a polarity selecting unit PNSEL inside an offset correction level generating circuit OFG. A current of the ISVo is set so as to reflect the result of the multiplication of the gain setting signal ASET with the reference setting level RFSET, and the PNSEL connects the current of the ISVo to either polarity in the differential output nodes (for the differential output signals OUTP' and OUTN') of the variable gain type differential amplifier circuit VGA1 based on the polarity selecting signal PNSET. For example, in the case that the two variable current sources ISVop and ISVon are provided as illustrated in FIG. 4A, there is a possibility that the variation in the characteristics between the two variable current sources affects the accuracy. However, by providing one variable current source ISVo as illustrated in FIG. 6, such a possibility can be eliminated. In addition, a circuit area can be also reduced.

<<Detailed Circuit Configuration of (Principal Part of) Semiconductor Device>>

Figure 7:
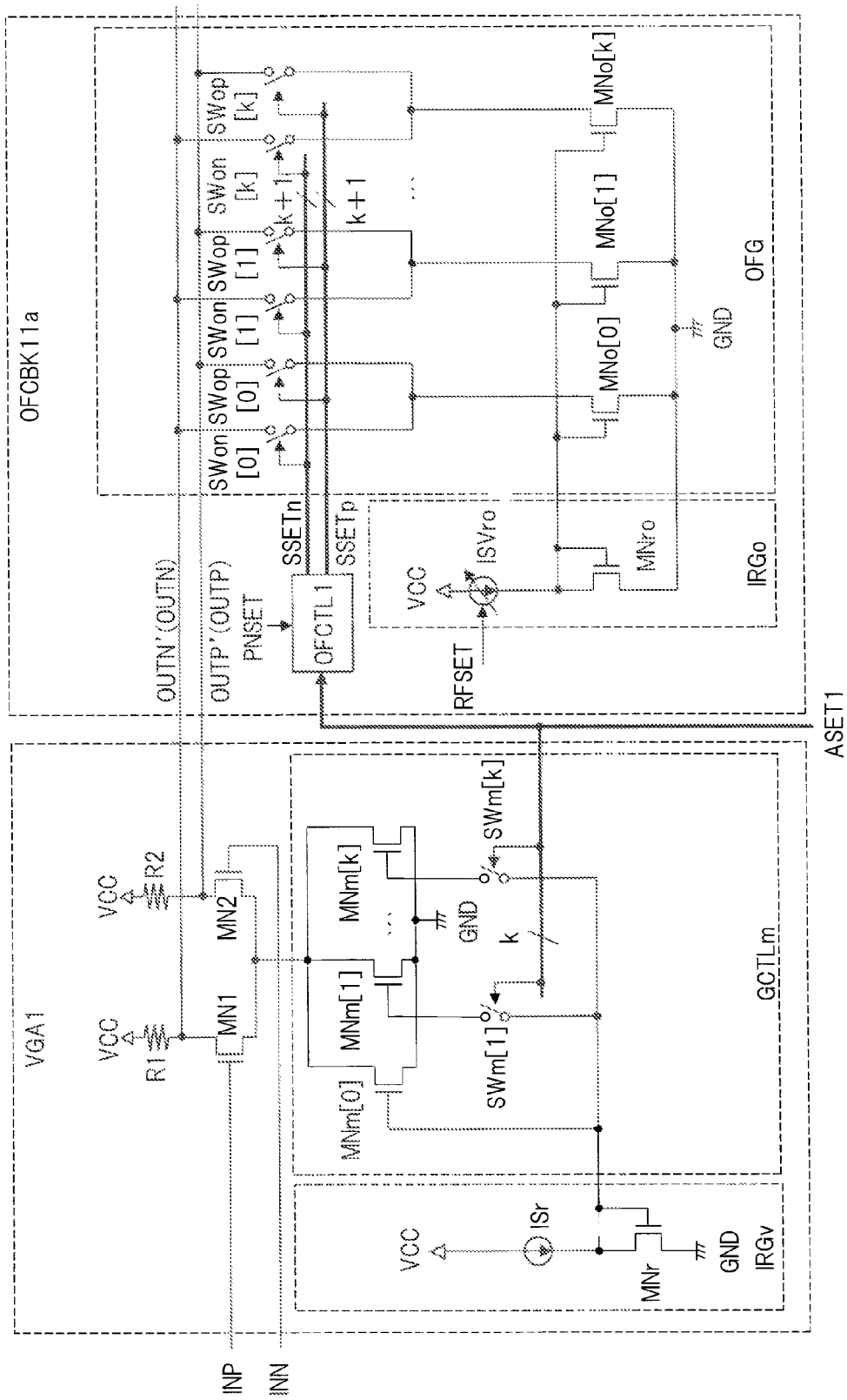
FIG. 7 is a circuit diagram illustrating a detailed configuration example of the semiconductor device in FIG. 6.

FIG. 7 is a circuit diagram illustrating a detailed configuration example of the semiconductor device of FIG. 6. A variable gain type differential amplifier circuit VGA1 illustrated in FIG. 7 to which the circuit mode described in FIG. 3A of the first embodiment is employed is provided with differential pair transistors (NMOS transistors MN1 and MN2); load resistors R1 and R2; and a gain control unit GCTLm and a reference current generation unit IRGv as a variable current source, A source voltage VCC is, for example, 1 V or others although not particularly limited.

Between a common source node of the NMOS transistors MN1, MN2 and the ground source voltage GND, the gain control unit GCTLm is provided with: a plurality of (k+1) NMOS transistors MNm[0] to MNm[k] having sources and drains connected in series to each other in parallel; and a plurality of (k) switches SWm[1] to SWm[k] whose one ends are connected to respective gates of the MNm[1] to the MNm[k] and whose other ends are commonly connected. The IRGv is provided with: a NMOS transistor MNr whose source is connected to the GND and whose gate and drain are connected commonly (that is, in diode connection); and a current source ISr which supplies a predetermined reference current to the MNr. Each gate (drain) of the MNr is connected to a common connecting node of the SWm[1] to the SWm[k] together with the gate of the MNm[0].

Here, although not particularly limited, for example, transistor sizes of the NMOS transistors MNm[1.] to MNm[k] are proportionally a power-of-two times different from each other. For example, with reference to the transistor size of the MNm[1], a size of the MNm[2] is $2^{(2-1)}$ times the size, ..., and a size of the MNm[k] is $2^{(k-1)}$ times the size. The NMOS transistor MNr configures a current mirror circuit with the NMOS transistors MNm[0], and besides, configures current mirror circuits with the MNm[1] to the MNm[k] corresponding to the ON switches SWm[1] to SWm[k] when the switches are turned ON.

Therefore, by providing a gain setting signal ASET1 as a digital signal of k bits for setting to turn the switches SWm[1] to SWm[k] ON/OFF, the gain control unit GCTLm can be functioned as the variable current source. For example, in an assumption that a current flowing through the MNm[1] is "I1" and a relation of "k=4" is established, a current can be set from the minimum 0 to the maximum (15×I1) (=(1+2+4+8) I1) in increments of an I1 step (that is, at 16 steps) by the MNm[1] to the MNm[4] The current of the variable current source is set to a value obtained by adding the variable current generated by the MNm[1] to the MNm[k] to a current flowing through the MNm[0]. Although not particularly limited, for example, based on a setting that the gain of the VGA1 is one-fold (original) value when only the MNm[0] is activated, a ratio of the variation in the gain with respect to the gain setting signal ASET1 is determined in accordance with a ratio of the transistor size between the MNm[0] and the MNm[1] and with the ON/OFF of the MNm[1] to the MNm[k].

In addition, an offset correcting circuit unit OFCBK11$a$ illustrated in FIG. 7 is provided with: an offset correction level generating circuit OFG; a reference current generation unit IRGo; and an offset correction level control unit OFCTL1. The IRGo is provided with: an NMOS transistor MNro whose source is connected to the ground source voltage GND in diode connection; and a variable current source ISVro which supplies a reference current to the MNro. The OFG is provided with: a plurality of (k+1) NMOS transistors MNo[0] to MNo[k] whose sources are connected to the GND and which configure current mirror circuits with the MNro; and a plurality of ((k+1)×2) switches SWon[0], SWop[0], and SWon[1] SWop[1], ..., Swon[k], and Swop[k].

One ends of the switches SWon[0] and SWop[0] are commonly connected to a drain of the MNo[0], the other end of the SWon[0] is connected to one (OUTN') of the differential output nodes of the variable gain type differential amplifier circuit VGA1, and the other end of the SWop[0] is connected to the other (OUTP') of the differential output nodes thereof. Hereinafter, similarly, for example, one ends of the SWon[k] and SWop[k] are commonly connected to a drain of the MNo[k], the other end of the SWon[k] is connected to one (OUTN') of the differential output nodes thereof, and the other end of the Swop[k] is connected to the other (OUTP') of the differential output nodes thereof.

Here, although not always limited, for example, transistor sizes of the MOS transistors MNo[1] to MNo[k] are proportionally a power-of-two times different from each other as similar to the above-described case of the MNm[1] to the MNm[k] inside the gain control unit GCTLm. For example, with reference to the transistor size of the MNo[1], a size of the MNo[2] is $2^{(2-1)}$ times the size, ..., and a size of the MNo[k] is $2^{(k-1)}$ times the size. In this manner, the MNo[1] to the MNo[k] are functioned as the variable current source. For example, in an assumption that a current flowing through the MNo[1] is "I2" and a relation of "k=4" is established, a current can be set from the minimum 0 to the maximum (15×I2) (=(1+2+4+8)I2) in increments of an I2 step (that is, at 16 steps) by the MNo[1] to the MNo[4] as similar to the above-described case of the MNm[1] to the MNm[4] inside the GCTLm.

In addition, the ratio of the transistor size between the NMOS transistors MNo[0] and MNo[1] is determined in accordance with the ratio of the variation in the gain with respect to the gain setting signal ASET1 in the above-described variable gain type differential amplifier circuit VGA1. For example, in the GCTLm if the gain is set to a one-fold (original) value when only the MNm[0] is activated and the gain is set to twice when all of the MNm[0] to MNm[k] are activated, the ratio of the transistor size therebetween is similarly adjusted so that a current upon the activation of all of the MNm[0] to MNm[k] is twice a current upon the activation of only the MNo[0] in the OFG. When the output resistance of the VGA1 is constant, the offset correction voltage becomes twice when the current becomes twice.

The offset correction level control unit OFCTL1 activates either line of the switch control signal SSETp or SSETn based on the polarity selecting signal. PNSET, and connects the above-described current generated by the MNo[0] to the MNo[k] to either polarity of the differential output node (OUTP' or OUTN'). The SSETn controls ON/OFF of the SWon[0] to the SWon[k], and the SSETp controls ON/OFF of the SWop[0] to the SWop[k], in addition, at this time, the OFCTL1 controls ON/OFF of the SWon[1] to the Swon[k] (or the SWop[1] to the SWop[k]) in coordination with the above-described ON/OFF control of the SWm[1] to SWm[k] inside the GCTLm based on the gain setting signal ASET1.

<<Initial Setting Method in Accordance with Offset Correction>>

Figure 8:
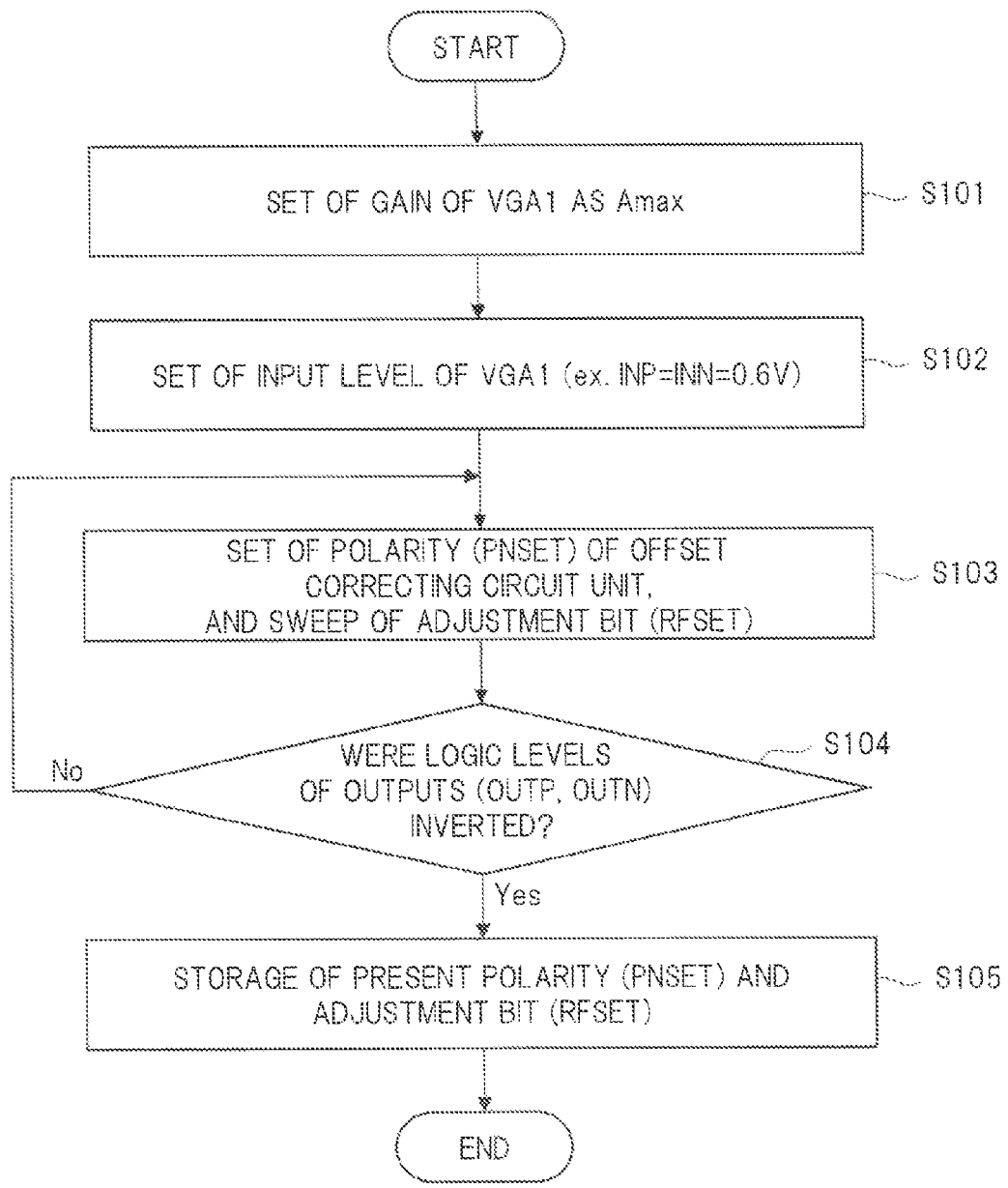
FIG. 8 is a flow chart illustrating an example of an initial setting method in accordance with offset correction of the semiconductor device of FIG. 7.

FIG. 8 is a flow chart illustrating an example of an initial setting method in accordance with the offset correction of the semiconductor device of FIG. 7. In FIG. 8, first, the gain of the variable gain type differential amplifier circuit VGA1 is set to the maximum value Amax (S101). That is, all of the switches SWm[1] to SWm[k] in the gain control unit GCTLm are controlled to be turned ON by the gain setting signal ASET1 of FIG. 7. Subsequently, an input level of the VGA1 is set (S102). That is, it is set that the differential input signals INP and INN of FIG. 7 are at the same electric potential and that the voltage has a voltage level (for example, 0.6 V or others) by which the NMOS transistors MN1 and MN2 are turned ON.

Subsequently, in a state that a polarity of the offset correcting circuit unit OFCBK11$a$ of FIG. 7 is set, a value of the variable current source ISVro inside the reference current generation unit IRGo is sequentially searched (S103). That is, for example, when the current value of the ISVro is zero, an output offset voltage having a predetermined polarity is outputted to the differential output nodes (OUTP' (OUTP) and OUTN' (OUTN)), and therefore, a polarity for canceling this polarity is determined by the polarity selecting signal PNSET. In addition, all of the switches SWon[1] and SWon[k] (or the SWop[1] to the SWop[k]) are controlled to be turned ON in accordance with this PNSET and the maximum value Amax configuration of the above-described gain setting signal ASET1, and besides, the SWon[0] (or SWop[0]) is controlled to be turned ON in accordance with the PNSET. Then, in this state, a current value of the ISVro is increased, in stepwise increment via an adjustment bit (corresponding to the reference setting level RFSET of FIGS. 6 and 7).

Then, the polarity inversion of the differential output nodes (OUTP' (OUTP) and OUTN' (OUTN)) is detected at any step (S104). Accordingly, by storing a value of the polarity selecting signal PNSET and a value of the adjustment bit (reference setting level RFSET) of the variable current source ISVro at the time of this detection of the polarity inversion (in S105), the initial setting can be completed. Hereinafter, by using this stored value, the offset correction current generated by the offset correction level generating circuit OFG is also appropriately changed so as to follow the change of the gain setting signal ASET1, so that the offset correction can be automatically performed. Further, since the initial setting is performed in the state that the gain of the variable gain type differential amplifier circuit VGA1 is the maximum value Amax, useful effects as described in the first embodiment can be obtained.

In the foregoing, by using the semiconductor device according to the present second embodiment, the same effects as the case of the first embodiment can be obtained, and the high speed performance in addition to the differential offset correction can be representatively achieved. In addition, the offset correction method described in the first embodiment can be achieved by the efficient circuit mode.

Third Embodiment

Summary of (Principal Part of) Semiconductor Device (Application Example [1])

Figure 9:
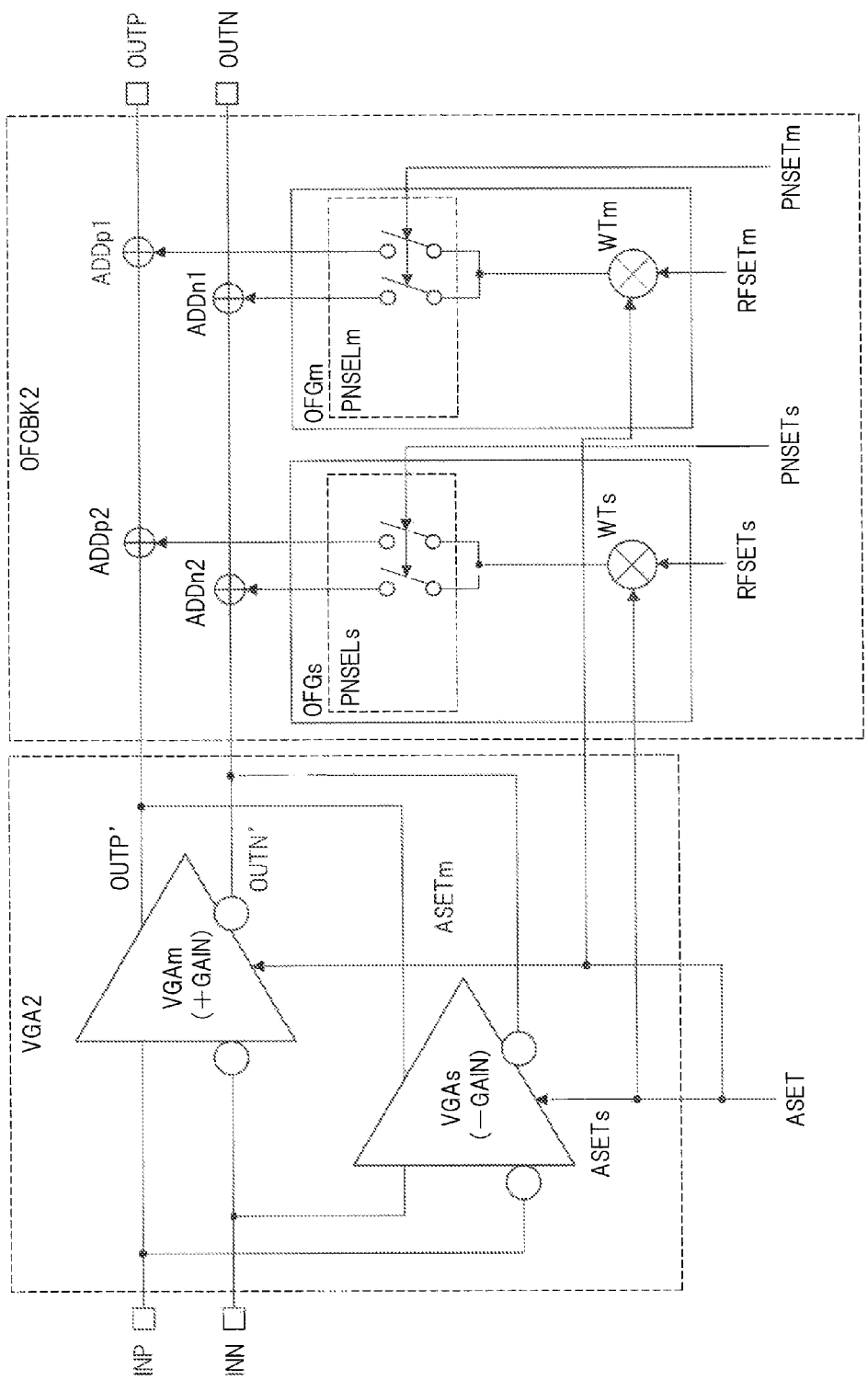
FIG. 9 is a functional block diagram illustrating a schematic configuration example of a principal part of a semiconductor device according to a third embodiment of the present invention.

FIG. 9 is a functional block diagram illustrating a schematic configuration example of a principal part of a semiconductor device according to a third embodiment of the present invention. The semiconductor device illustrated in FIG. 9 is an application example of the semiconductor device according to the first embodiment described in FIG. 1, and is different from FIG. 1 in that a variable gain type differential amplifier circuit VGA2 is configured of two variable gain type differential amplifier circuits VGAm and VGAs. Further, in accordance with this difference, it is different in that an offset correcting circuit unit OFCBK2 is provided with two offset correction level generating circuit OFGm and OFGs and two sets of adder units ADDp1 and ADDn1, and ADDp2 and ADDn2.

In FIG. 9, the VGAm, the OFGm, the ADDp1, and the ADDn1 configure a main-side circuit unit so as to achieve a positive amplifying operation and an offset correction in accordance with this amplifying operation. On the other hand, the VGAs, the OFGs, the ADDp2, and the ADDn2 configure a sub-side circuit unit so as to achieve a negative amplifying operation (that is, an attenuating operation) and an offset correction in accordance with this amplifying operation. Here, for the common differential output node (for a state that the output polarities of the differential output signals OUTP' and OUTN' are the same), the VGAm receives the differential input signals INP and INN with the input polarity on the positive electrode side, and the VGAs receives the INP and the INN with the input polarity on the negative electrode side.

As a result, for the differential output signals OUTP' and OUTN', a result is obtained by subtracting a signal obtained by amplifying the INP and the INN by the gain of the VGAs from a signal obtained by amplifying the differential input signals INP and INN by the gain of the VGAm. The gain of the VGAm is determined by a main-side gain setting signal ASETm which is a part of the gain setting signal ASET, and the gain of the VGAs is also determined by a sub-side gain setting signal ASETs which is a part of the gain setting signal ASET. Note that the input polarities are configured here to be different from each other with reference to the output polarities. However, as a matter of course, the output polarities may be configured to be different from each other with reference to the input polarities.

Figure 5B:
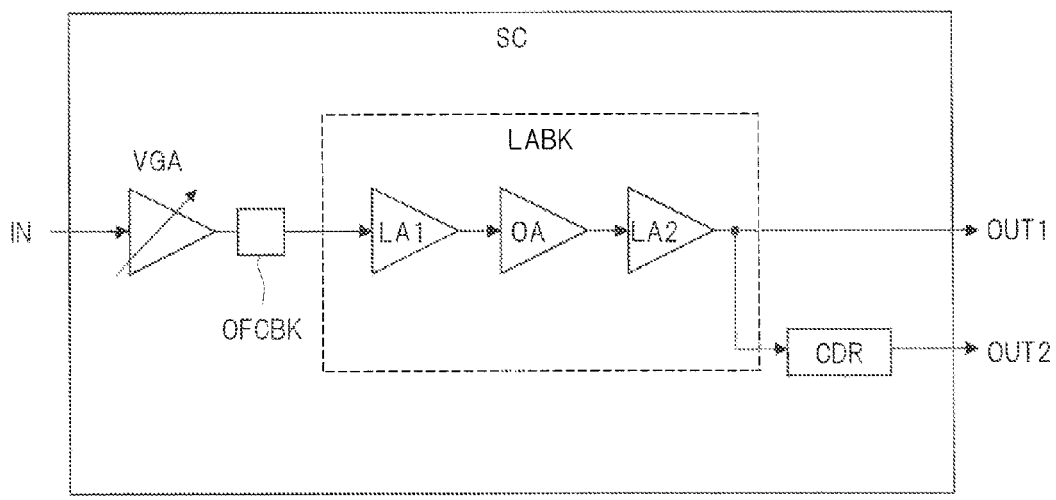
FIG. 5B is a block diagram illustrating a configuration example of a re-driving circuit (semiconductor device) in FIG. 5A.

When such a configuration is used, the amplifying operation and the attenuating operation can be achieved by appropriately combining the gain of the VGAm and the gain of the VGAs. Although not particularly limited, for example, the amplifying operation is performed between 0 [dB] and "+X" [dB] by using the VGAm in a state that the VGAs is turned OFF, and the attenuating operation is performed between 0 [dB] and "−Y" [dB] by using the VGAs in a state that the VGAm is set to 0 [dB]. For example, in the communication device as illustrated in FIG. 5, not only the amplifying operation but also the attenuating operation are required in some cases in accordance with the length of the communication route on the backplane BKP as described above. In such a case, it is useful to use the configuration example as illustrated in FIG. 9.

The configuration and the operation for each of the main-side circuit unit and the sub-side circuit unit are the same as the case of FIG. 1. That is, in the main-side circuit unit, the offset correction level generating circuit. OFGm generates a correction level which cancels an offset voltage of the VGAm, and adds the correction level to the common differential output nodes (OUTP' and OUTN') via the adder units ADDp1 and ADDn1. In this manner, the offset voltage of the VGAm is corrected. At this time, a weighting unit (multiplication unit) WTm inside the OFGm receives the gain setting signal ASETm and a reference setting level RFSETm for the VGAm, and generates the correction level, and outputs it toward the ADDp1 and the ADDn1 via a polarity selecting unit PNSELm (with a polarity selecting signal PNSETm) for the VGAm.

Similarly in the sub-side circuit unit, the offset correction level generating circuit. OFGs generates a correction level which cancels an offset voltage of the VGAs, and adds the correction level to the common differential output nodes (OOUTP' and OUTN') via the adder units ADDp2 and ADDn2. In this manner, the offset voltage of the VGAs is corrected. At this time, a weighting unit (multiplication unit) WTs inside the OFGs receives the gain setting signal ASETs and a reference setting level RFSETs for the VGAs, and generates the correction level, and outputs it toward the ADDp2 and the ADDn2 via a polarity selecting unit PNSELs (with a polarity selecting signal PNSETs) for the VGAs.

At this time, in the initial setting in accordance with the offset correction as described in the first embodiment, for example, the reference setting level RFSETm and a polarity selecting signal PNSETm for the VGAm can be determined in a state that the VGAm is activated (the VGAs is deactivated (that is, the gain is fixed to zero)). Similarly, for example, the reference setting level RFSETs and a polarity selecting signal PNSETs for the VGAs can be determined in a state that the VGAs is activated (the VGAm is deactivated (that is, the gain is fixed to zero)). In this manner, the offset correction in accordance with the gain can be automatically performed even in any combination between the gain of the VGAm and the gain of the VGAs on practical operation.

<<Details of Variable Gain Type Differential Amplifier Circuit (Application Example [1])>>

Figure 10:
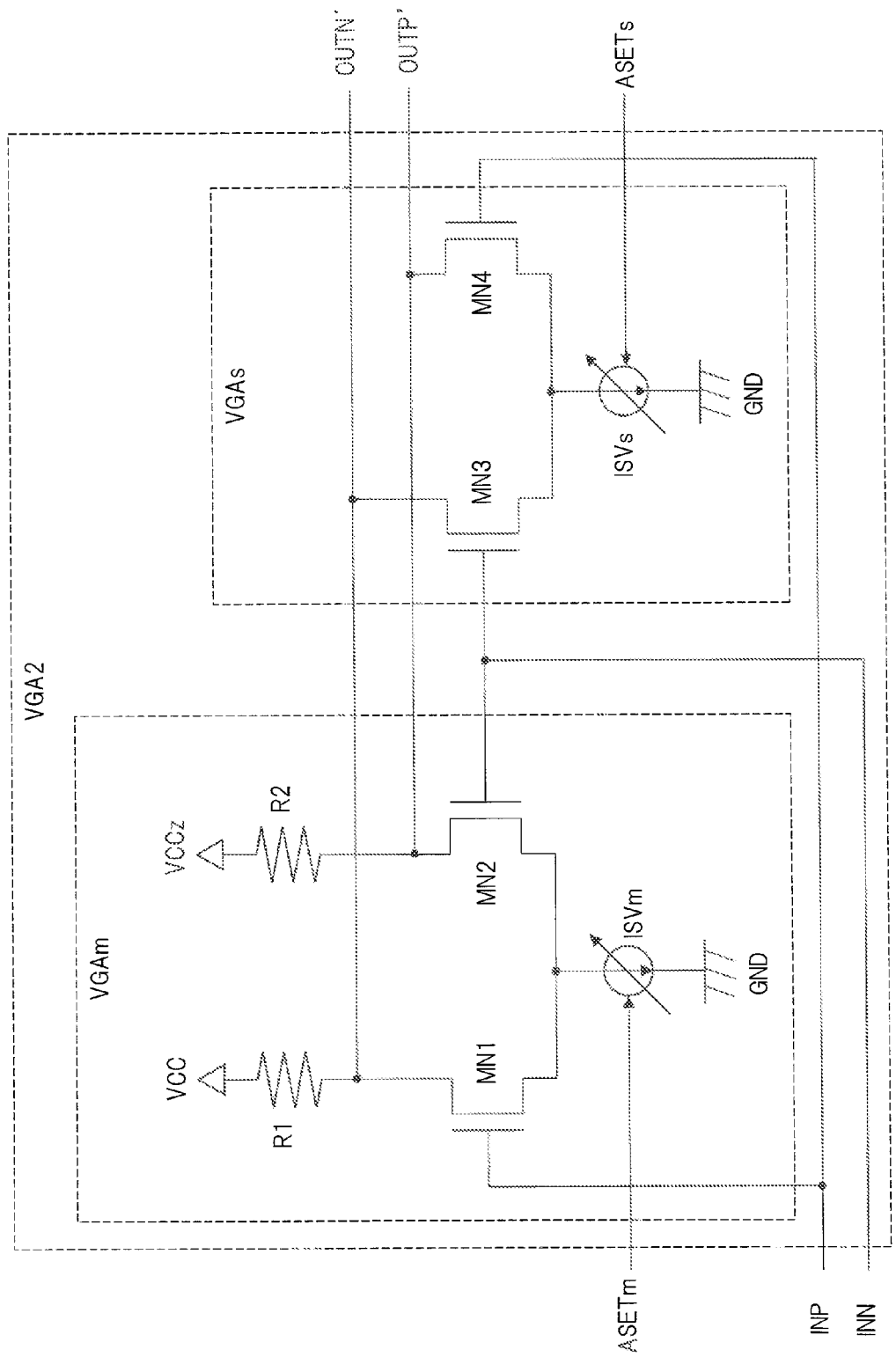
FIG. 10 is a circuit diagram illustrating a detailed configuration example of a variable gain type differential amplifier circuit in FIG. 9.

FIG. 10 is a circuit diagram illustrating a detailed configuration example of the variable gain type differential amplifier circuit in FIG. 9, A variable gain type differential amplifier circuit. VGA2 of FIG. 10 is a variable gain type differential amplifier circuit of a mixer type, and is provided with: a main-side variable gain type differential amplifier circuit. VGAm; and a sub-side variable gain type differential amplifier circuit VGAs. Similar to the case of FIG. 3A, the VGAm is provided with: the differential pair transistors (NMOS transistors MN1 and MN2); load resistors R1 and R2; and a tail current source (variable current source ISVm). In the MN1, a gate receives the positive-electrode side differential input signal INP, and the negative-electrode side differential output signal OUTN' is outputted from a drain. In the MN2, a gate receives the negative-electrode side differential input signal INN, and the positive-electrode side differential output signal OUTP' is outputted from a drain. Note that a current value of the ISVm is determined by the gain setting signal ASETm for the VGAm.

On the other hand, the VGAs is provided with: the differential pair transistors (NMOS transistors MN3 and MN4);

and a tail current source (variable current source ISVs), and is provided with the load resistors R1 and R2 commonly used (Shared) with the VGAm. In the MN3, while the drain is commonly connected with the drain (the negative-electrode side differential output node (OUTN')) of the MN1, the negative-electrode side differential input signal INN is inputted to the gate as different from the MN1. Similarly, in the MN4, while the drain is commonly connected with the drain (the positive-electrode side differential output node (OUTP')) of the MN2, the positive-electrode side differential input signal INP is inputted to the gate as different from the MN2. Note that a current value of the ISVs is determined by the gain setting signal ASETs for the VGAs.

Here, for example, when a "+"-direction AC current (+$\Delta i1$) is flown through the MN1 based on a level (+$\Delta V$) of the INP and a mutual conductance (gm1) in accordance with the ISVm, a "−"-direction AC current (−$\Delta i3$) is flown through the MN3 based on a level (−$\Delta V$) of the INN and a mutual conductance (gm3) in accordance with the ISVs. As a result, an AC current expressed as "($\Delta i1 - \Delta i3$)" is flown through the R1 and is converted into a voltage, and therefore, magnitudes of the $\Delta i1$ and the $\Delta i3$ are appropriately adjusted in a range in which the output polarity is not changed (for example, a range of "$\Delta i1 > \Delta i3$") by using the ISVm (ASETm) and the ISVs (ASETs), so that the amplifying operation and the attenuating operation can be achieved.

In the foregoing, by using the semiconductor device according to the present third embodiment, the same effects as the case of the first embodiment can be obtained, and the high speed performance in addition to the differential offset correction can be representatively achieved. Further, in both of the amplifying operation and the attenuating operation, such effects can be obtained. Note that the circuit mode of FIG. 3A has been employed as the variable gain type differential amplifier circuits VGAm and VGAs in FIG. 10. However, as a matter of course, the circuit modes as illustrated in FIGS. 33 to 3D can be employed.

Fourth Embodiment

Summary of (Principal Part of) Semiconductor Device (Application Example [1'])

Figure 11:
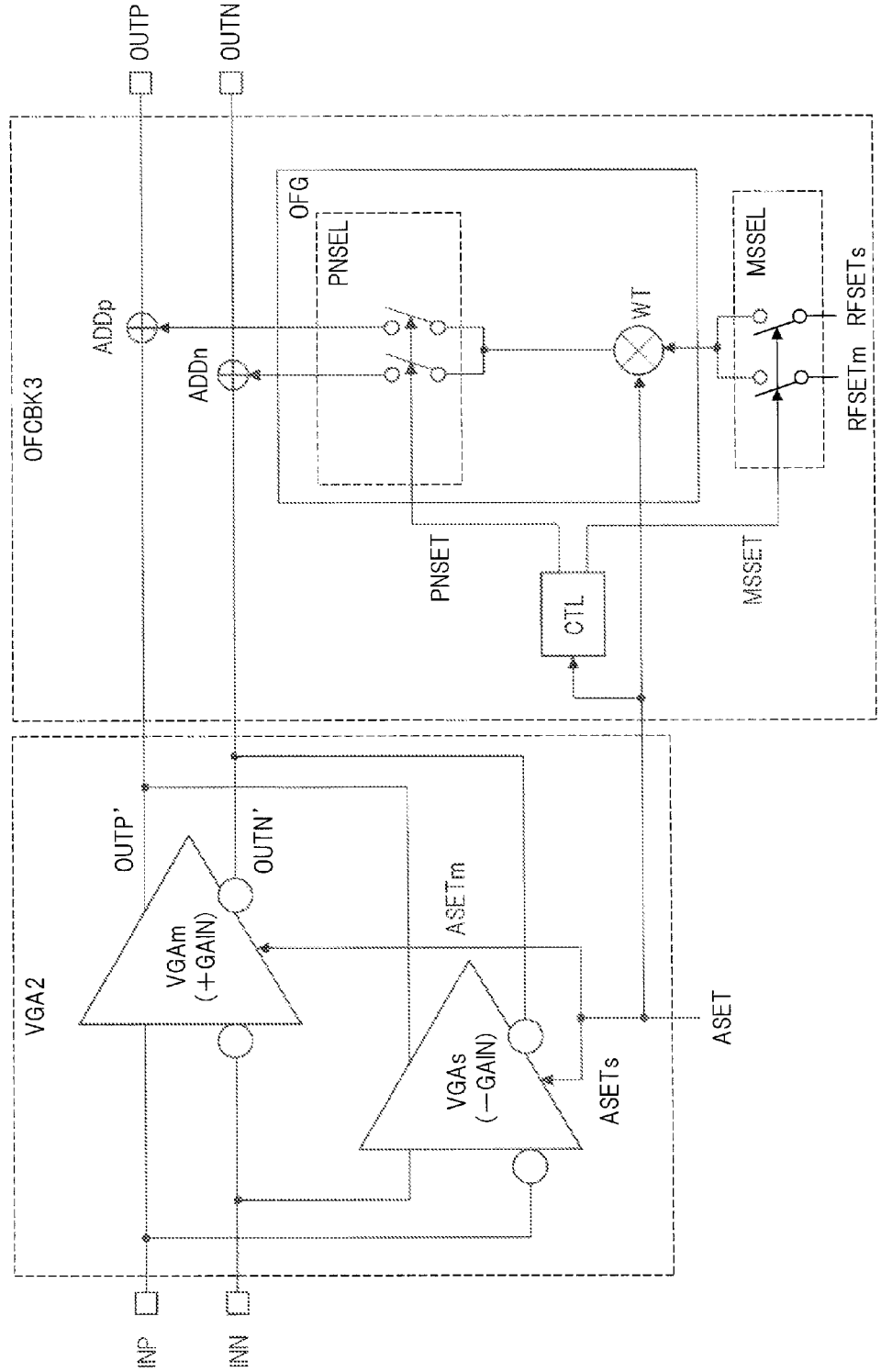
FIG. 11 is a functional block diagram illustrating a schematic configuration example of a principal part of a semiconductor device according to a fourth embodiment of the present invention.

FIG. 11 is a functional block diagram illustrating a schematic configuration example of a principal part of a semiconductor device according to a fourth embodiment of the present invention. The semiconductor device illustrated in FIG. 11 is a modification example of the semiconductor device according to the third embodiment described in FIG. 9. The semiconductor device illustrated in FIG. 11 is different from FIG. 9 in that one offset correction level generating circuit OFG and one set of adder units ADDp and ADDn are provided inside an offset correcting circuit unit. OFCBK3, and in that a reference setting level selecting unit MSSEL and a control unit CTL are newly added. A variable gain type differential amplifier circuit. VGA2 of FIG. 11 is the same as the case of FIG. 9, and is provided with a main-side variable gain type differential amplifier circuit VGAm and a sub-side variable gain type differential amplifier circuit VGAs.

For example, in the VGA2, in such a case that only the VGAm is operated when the amplifying operation is performed and that the VGAs is operated when the attenuating operation is performed in a state that the gain of the VGAm is fixed, only either the output offset voltage of the VGAm or the output offset voltage of the VGAs is changed so as to follow the change of the gain setting signal ASET. Therefore, for the offset correction level generating circuits OFG, two circuits are not always required so as to correspond to the main side and the sub side, and one circuit can be shared. In this manner, the circuit area can be reduced. In addition, when two offset correction level generating circuits are provided, there is the possibility of the influence on the accuracy due to the variation in the characteristics between the two circuits. However, by sharing one circuit, such a possibility can be eliminated.

However, when one circuit is shared, it is required to correct the output offset voltage on the VGAm side in the amplifying operation so as to follow the ASET, and to correct the output offset voltage on the VGAs side in the attenuating operation so as to follow the ASET. Then, here, these two types of the correction objects are switched by the reference setting level selecting unit MSSEL. The MSSEL selects a main reference setting level RFSETm or a sub reference setting level RFSETs in accordance with a reference setting level selection signal MSSET outputted from the control unit CTL, and outputs it to the weighting unit (multiplication unit) WT inside the OFG. At this time, the CTL outputs the MSSET and the polarity selecting signal PNSET corresponding to the MSSET so as to set a polarity corresponding to the RFSETm and a polarity corresponding to the RFSETs via the polarity selecting unit PNSEL. Note that the CTL outputs such a MSSET and such a PNSET by receiving the gain setting signal ASET and determining the amplifying operation or the attenuating operation.

<<Detailed Circuit Configuration of (Principal Part of) Semiconductor Device (Application Example [1'])>>

Figure 12:
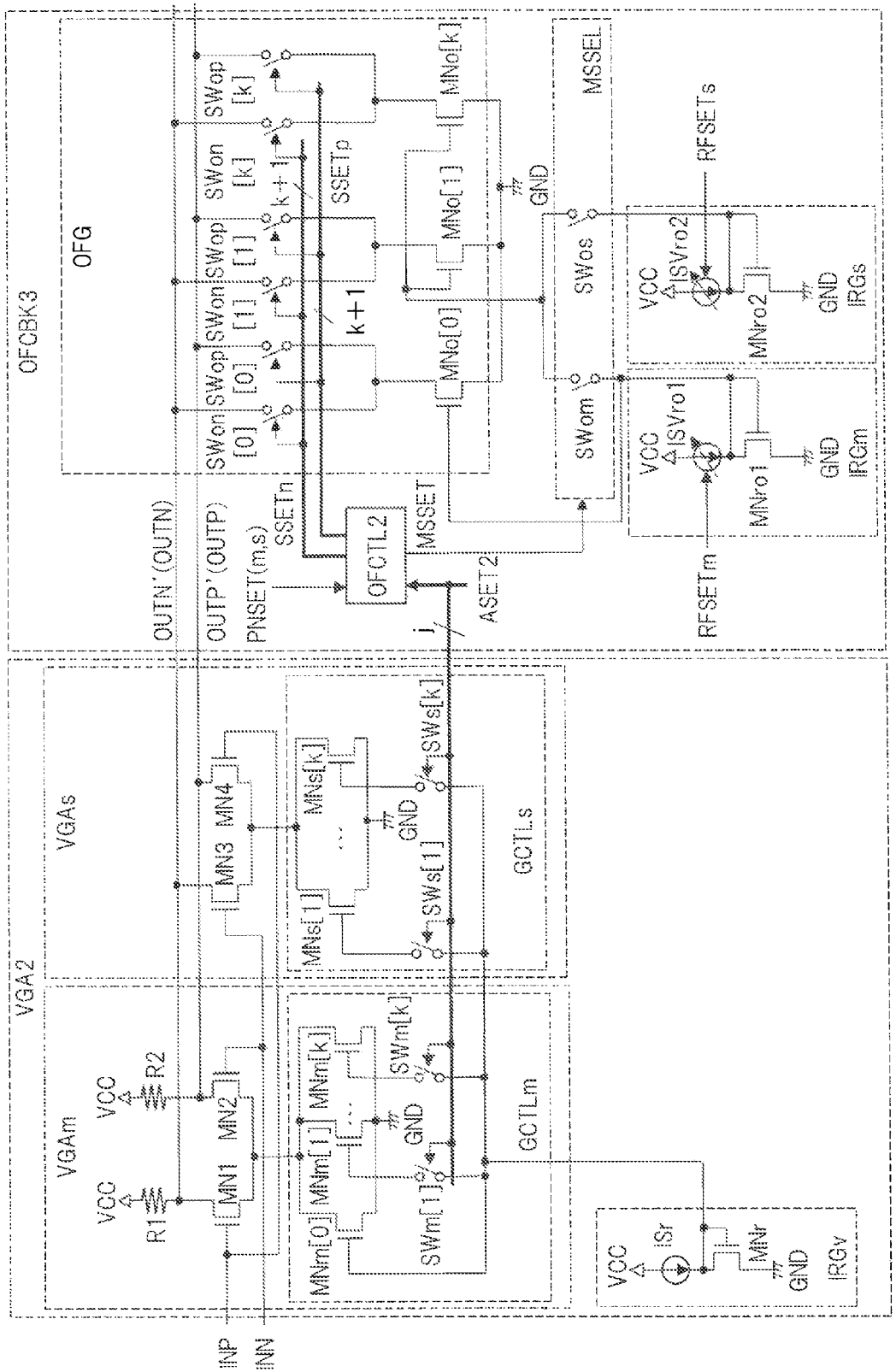
FIG. 12 is a circuit diagram illustrating a detailed configuration example of the semiconductor device in FIG. 11.

FIG. 12 is a circuit diagram illustrating the detailed configuration example of the semiconductor device of FIG. 11. In FIG. 12, the main-side variable gain type differential amplifier circuit VGAm inside the variable gain type differential amplifier circuit VGA2 has the same circuit configuration as that of the above-described VGA1 of FIG. 7. On the other hand, as described in FIG. 10, the sub-side variable gain type differential amplifier circuit VGAs inside the VGA2 is provided with: the differential pair transistor (NMOS transistors MN1 and MN2) inside the VGAm; the differential pair transistors (NMOS transistors MN3 and MN4) commonly using a drain node; and a gain control unit GCTLs connected to a common source node of the differential pair transistors.

Similarly to the gain control unit GCTLm inside the VGAm (inside the VGA1 of FIG. 7), the gain control unit GCTLs is provided with: a plurality of (k) NMOS transistors MNs[1] to MNs[k] whose sources and drains are connected in parallel between a common source node of the MN3, MN4 and the GND; and switches SWs[1] to SWs[k] whose one ends are connected to the respective gates of the NMOS transistors. The transistor sizes of the MNs[1] to MNs[k] are proportionally, for example, a power-of-two times different from each other as similar to the case of the MNm[1] to the MNm[k] inside the GCTLm. The other ends of the SWs[1] to the SWs[k] are commonly connected to the gate (drain) of the NMOS transistor MNr in the reference current generation unit IRGv described in FIG. 7. However, the GCTLs is not provided with a transistor corresponding to the NMOS transistor MNm[0] as different from the GCTLm.

Here, when the amplifying operation is performed, for example, all of the switches SWs[1] to SWs[k] inside the GCTLs are controlled to be turned OFF by the gain setting signal ASET2, and besides, each of the switches SWm[1] to SWm[k] inside the GCTLm is controlled to be turned ON/OFF by the ASET2 in accordance with a gain (amplifying amount). On the other hand, when the attenuating operation is performed, for example, all of the switches SWm[1] to SWm[k] inside the GCTLm are controlled to be turned OFF by the ASET2, and besides, each of the switches SWs[1] to SWs[k] inside the GCTLs are controlled to be turned ON/OFF by the ASET2 in accordance with a gain (attenuating amount). That is, for example, a gain of the VGAm is set to 0 [dB] (one-fold (original) value) by the MNm[0] inside the GCTLm, and the attenuating operation is performed by appropriately controlling a current (corresponding to a subtraction current) inside the GCTLs with reference to a current of this MNm[0].

In addition, the offset correcting circuit unit OFCBK3 of FIG. 12 is provided with: the offset correction level generating circuit OFG; the reference setting level selecting unit MSSEL; the reference current generation units IRGm and IRGs; and the offset correction level control unit OFCTL2. As similar to the configuration of FIG. 7, the OFG is provided with: a plurality of (k+1) NMOS transistors MNo[0] to MNo [k]; and a plurality of ((k+1)×2)) switches SWon[0] SWop[0], SWon[1], Swop[1], . . . , Swon[k], and SWop[k.]

The IRGm is used for the main (VGAm), and is provided with: a diode-connected NMOS transistor MNro1; and a variable current source ISVro1 which supplies a current to the NMOS transistor, as similar to the IRGo of FIG. 7. Similarly, the IRGs is used for the sub (VGAs), and is provided with: a diode-connected NNOS transistor MNro2; and a variable current source ISVro2. The MSSEL is provided with switches SWom and SWos which are controlled to be turned ON/OFF by the reference setting level selection signal MSSET. The MNo[1] to the MNo[k] inside the OFG configure current mirror circuits with the MNro1 inside the IRGm when the SWom is controlled to be turned ON, and configure current mirror circuits with the MNro2 inside the IRGs when the SWos is controlled to be turned ON. In addition, regardless of the states of the SWom and the SWos, the MNo[0] inside the OFG configures a current mirror circuit with the MNro1 inside the IRGm.

As similar to the case of the OFCTL1 of FIG. 7, the offset correction level control unit OFCTL2 receives the gain setting signal ASET2 and the polarity selecting signal PNSET, and outputs switch control signals SSETp and SSETn. However, as different from the case of FIG. 7, the PNSET includes two types of signals (PNSETm and PNSETs) since an offset polarity on the VGAm side and an offset polarity on the VGAs side independently exist. Further, as described in FIG. 11, the OFCTL2 determines the amplifying operation or the attenuating operation after receiving the ASET2, and appropriately sets the polarities of switches Swon[0] to SWon[k] and SWop [0] to SWop[k] by using information on the PNSETm and the PNSETs, and besides, outputs the reference setting level selection signal MSSET.

For example, when the amplifying operation is set for the VGA2, the OFCTL2 acquires a polarity which cancels a polarity of an output offset voltage of the VGAm from the PNSETm, and controls to turn ON/OFF the SWon[1] to SWon[k] (or SWop[1] to SWop[k]) by using either the SSETp or the SSETn in accordance with the polarity. This ON/OFF control is performed in cooperation with the control of the SWm[1] to the SWm[k] inside the GCTLm by the ASET2. In addition, the OFCTL2 controls the SWom to be turned ON via the MSSET. On the other hand, when the attenuating operation is set for the VGA2, the OFCTL2 acquires a polarity which cancels a polarity of an output offset voltage of the VGAs from the PNSETs, and controls to turn ON/OFF the SWon[1] to SWon[k] (or SWop[1] to SWop[k]) by using either the SSETp or the SSETn in accordance with this polarity. This ON/OFF control is performed in cooperation with the control of the SWs[1] to the SWs[k] inside the GCTLs by the ASET2. In addition, the OFCTL2 controls the SWos to be turned ON via the MSSET.

In addition, for example, the OFCTL2 sets a polarity determined by the PNSETm for the SWon[0] and the SWop[0] via, the SSETn and the SSETp commonly in the amplifying operation and the attenuating operation. That is, here, the MNo[0], the Swon[0], and the SWop[0] inside the OFG correspond to the MNm[0] inside the GCTLm, and the operation of the VGAm using the MNm[0] is performed commonly in the amplifying operation and the attenuating operation. Accordingly, the OFCTL2 corrects an output offset voltage in accordance with this operation of the VGAm by using the MNo[0], the SWon[0], and the SWop[0].

<<Initial Setting Method in Accordance with Offset Correction (Application Example [1'])>>

FIG. 13 is a flow chart illustrating an example of an initial setting method in accordance with the offset correction of the semiconductor device of FIG. 12. In FIG. 13, steps S201a to S205a are for the initial setting method which targets the main side (VGAm) and steps S201b to S205b are for the initial setting method which targets the sub side (VGAs). However, since each of the initial setting methods is almost the same as the above-described steps S101 to S105 of FIG. 8, brief description will be made here with focusing on a different point from FIG. 8.

First, in Step S201a, a gain of the VGA2 is set to the maximum value Amax as similar to the case of FIG. 8. In this case, in FIG. 12, all of the switches SWm[1] to SWm[k] inside the GCTLm are controlled to be turned ON, and all of the switches SWs[1] to SWs[k] inside the GCTLs are controlled to be turned OFF. As a result, the VGAm is activated at the maximum gain, and the VGAs is deactivated (that is, a gain is fixed to zero). In addition, in accordance with the set of the Amax, the switch SWom inside the MSSEL is controlled to be turned ON, and the SWos is controlled to be turned OFF. In this state, by performing processes of S202a to S204a (corresponding to S102 to S104 of FIG. 8) as similar to the case of FIG. 8, the polarity selecting signal PNSETm on the main side is determined, and a current value (corresponding to the reference setting level RFSETm) of the variable current source ISVro1 inside the IRGm is determined. Then, in Step S205a, the PNSETm and the RFSETm are stored, so that the initial setting on the main side is completed.

Subsequently, in Step S201b, a gain of the VGA2 is set to the minimum value Amin. In this case, in FIG. 12, all of the switches SWm[1] to SWm[k] inside the GCTLm are controlled to be turned OFF, and all of the switches SWs[1] to SWs[k] inside the GCTLs are controlled to be turned ON. As a result, the VGAm is activated via only the MNm[0] inside the GCTLm, and the VGAs is activated at the maximum gain (the minimum gain as the VGA2) in addition, in accordance with the set of the Amin, the switch SWom inside the MSSEL is controlled to be turned OFF, and the SWos is controlled to be turned ON. Here, an output offset voltage generated by the VGAm is in such a state as already being corrected via the MNo[0], the SWon[0], and the Swop[0] in accordance with the above-described storage process in Step S205a.

In this state, by performing processes of S202b to S204b (corresponding to S102 to S104 of FIG. 8) as similar to the case of FIG. 8, the polarity selecting signal PNSETs on the sub side is determined, and a current value (corresponding to the reference setting level RFSETs) of the variable current source ISVro2 inside the IRGs is determined. Then, in Step S205b, the PNSETs and the RFSETs are stored, so that the initial setting on the sub side is completed, and all of the initial settings are completed.

In such an initial setting, regardless of the amplifying operation and the attenuating operation, the offset correction can be automatically achieved in accordance with the gain by using these stored PNSETm, RFSETm, PNSETs, and RFSETs on practical operation. In addition, by performing the initial setting in the state that the gain is set to the maximum value or the minimum value, various useful effects as described above can be obtained. Note that the initial setting on the VGAs side is performed in the state that the VGAm is activated so as to follow the practical operation here. However, the initial setting on the VGAs side can be also performed by structuring a state that the VGAm side is deactivated so that the correction current via the MNo[0] does not flow. However, in this case, there is a risk that it is required to separately provide an operation mode for the initial setting in order to structure the environment of the initial setting or a risk that errors due to difference from a practical operation occur, and therefore, it is desired from this viewpoint to use such a method as illustrated in FIG. 13.

In the foregoing, by using the semiconductor device according to the present fourth embodiment, the same effects as the case of each embodiment hitherto are obtained, and the high speed performance in addition to the differential offset correction can be representatively achieved. Further, in both of the amplifying operation and the attenuating operation, such effects can be obtained by using an efficient circuit mode.

In the foregoing, the invention made by the present inventors has been concretely described based on the embodiments. However, the present invention is not limited to the foregoing embodiments and various modifications can be made within the scope of the present invention. For example, the above-described embodiments are explained in detail in order to easily explain the present invention, and the invention is not always limited to the one provided with all of the explained configurations. Also, a part of the configuration of one embodiment can be replaced with the configuration of another embodiment, and besides, the configuration of another embodiment can be also added to the configuration of one embodiment. Further, another configuration can be added/removed/replaced to/from a part of the configuration of each embodiment.

What is claimed is:

1. A semiconductor device comprising:
a variable gain type differential amplifier circuit which receives a gain setting signal, amplifies differential input signals by a gain indicated by the gain setting signal, and outputs differential output signals; and
a correcting circuit which cancels an offset voltage generated in the differential amplifier circuit;
the correcting circuit cancelling the offset voltage by receiving the gain setting signal, generating a correction voltage charged in accordance with the gain, and adding the correction voltage to the differential output signals,
wherein the correcting circuit includes a variable current source for correction connected to differential output nodes from which the differential output signals are outputted, and
the variable current source for correction generates a correction current corresponding to the correction voltage by changing a predetermined reference current in proportion to the gain, and
wherein the correcting circuit includes:
a variable current source for reference which sets a current value of the reference current;
a first reference transistor to which a current from the variable current source for reference is supplied;
a first transistor, a second transistor, a first positive electrode switch, a second positive electrode switch, a first negative electrode switch, and a second negative electrode switch, which are included in the variable current source for correction; and
a control circuit, and
the first transistor configures a current mirror circuit with the first reference transistor so as to generate a first current,
the second transistor configures a current mirror circuit with the first reference transistor so as to generate a second current,
the first positive electrode switch and the second positive electrode switch connect the first current and the second current to respective positive electrodes of the differential output nodes,
the first negative electrode switch and the second negative electrode switch connect the first current and the second current to respective negative electrodes of the differential output nodes, and,
in accordance with change of the gain setting signal, the control circuit changes ON/OFF states of the first positive electrode switch and the second positive electrode switch in a state that both of the first negative electrode switch and the second negative electrode switch are controlled to be turned OFF, or changes ON/OFF states of the first negative electrode switch and the second negative electrode switch in a state that both of the first positive electrode switch and the second positive electrode switch are controlled to be turned OFF.

2. The semiconductor device according to claim 1, wherein the second transistor has a transistor size which is twice that of the first transistor.

3. A semiconductor device comprising:
a variable gain type first differential amplifier circuit to which first differential input signals and a first gain setting signal are inputted, which amplifies the first differential input signals by a first gain indicated by the first gain setting signal, and which outputs first differential output signals to differential output nodes;
a variable gain type second differential amplifier circuit to which second differential input signals having a reverse polarity from but the same level as those of the first differential input signals and a second gain setting signal are inputted, which amplifies the second differential input signals by a second gain indicated by the second gain setting signal, and which adds second differential amplification signals of a result of this amplification to the first differential output signals in the differential output nodes; and
a correcting circuit which cancels a first offset voltage generated in the first differential amplifier circuit, and besides, which cancels a second offset voltage generated in the second differential amplifier circuit, and
the correcting circuit cancelling the first offset voltage by receiving the first gain setting signal, generating a first correction voltage changed in accordance with the first gain, and adding the first correction voltage to the first differential output signals, and besides, cancelling the second offset voltage by receiving the second gain setting signal, generating a second correction voltage changed in accordance with the second gain, and adding the second correction voltage to the second differential output signals.

4. The semiconductor device according to claim 3, wherein the first differential amplifier circuit is used with a fixed gain when the second gain is to be changed,
the second differential amplifier circuit is used with a fixed gain when the first gain is to be changed, the correcting circuit includes:

a variable current source for correction connected to the differential output nodes;

a first reference current source which generates a first reference current; and a second reference current source which generates a second reference current, and the variable current source for correction changes the first reference current in proportion to the first gain when the first gain is to be changed so as to generate a first correction current corresponding to the first correction voltage, and changes the second reference current in proportion to the second gain when the second gain is to be changed so as to generate a second correction current corresponding to the second correction voltage.

5. The semiconductor device according to claim 3, wherein the first differential amplifier circuit includes:

first differential pair transistors to which the first differential input signals are inputted and whose one ends are commonly connected;

a load circuit for amplification connected to the other ends of the first differential transistors; and a first tail current source whose one end is connected to a common connection node of the first differential pair transistors, the second differential amplifier circuit includes:

second differential pair transistors to which the second differential input signals are inputted, whose one ends are commonly connected, and whose other ends are connected to the load circuit for amplification; and a second tail current source whose one end is connected to a common connection node of the second differential pair transistors, a current of the first tail current source is changed in proportion to the first gain, and a current of the second tail current source is changed in proportion to the second gain.

6. The semiconductor device according to claim 5, wherein each of the first reference current source and the second reference current source is a variable current source, and a first set current value of the first reference current source is determined by performing a search operation of the first set current value in a state that the first differential input signals are set to zero and that the first gain is set to the maximum gain, and a second set current value of the second reference current source is determined by performing a search operation of the second set current value in a state that the second differential input signals are set to zero and that the second gain is set to the maximum gain.

* * * * *